US006618411B1

United States Patent
Takiguchi et al.

(10) Patent No.: US 6,618,411 B1
(45) Date of Patent: Sep. 9, 2003

(54) SEMICONDUCTOR LASER ELEMENT

(75) Inventors: Tohru Takiguchi, Tokyo (JP); Kyosuke Kuramoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/632,908

(22) Filed: Aug. 4, 2000

(30) Foreign Application Priority Data

Feb. 17, 2000 (JP) ..................................... P2000-039250

(51) Int. Cl.[7] ................................................. H01S 3/19
(52) U.S. Cl. .......................................... 372/45; 372/46
(58) Field of Search ............................. 372/43, 45, 46, 372/50

(56) References Cited

U.S. PATENT DOCUMENTS

| 5,309,465 A | * | 5/1994 | Antreasyan et al. | .......... 372/45 |
| 5,379,312 A | * | 1/1995 | Bour et al. | .................... 372/46 |
| 6,358,316 B1 | * | 3/2002 | Kizuki et al. | ................ 117/105 |

FOREIGN PATENT DOCUMENTS

JP 11-54837 2/1999

OTHER PUBLICATIONS

Lin et al., "Low Crosstalk And Highly Reliable 12 Element 1.3 $\mu$m AlGaInAs/InP Laser Arrays", Electronics Letters, vol. 34, No. 8, Apr. 1998, pp. 776–777.

* cited by examiner

Primary Examiner—Minh Loan Tran
(74) Attorney, Agent, or Firm—Leydig, Voit & Mayer, Ltd.

(57) ABSTRACT

A ridge waveguide semiconductor laser that is excellent in optical output characteristic and high-frequency characteristic is provided. A p-type InP cladding layer having a ridge shape is formed over a p-type AlInAs cladding layer via a p-type InP layer and a p-type GaInAsP etching stopper layer, thereby suppressing the increase in the series resistance due to discontinuous band structure between an etching stopper layer and the AlGaInAs cladding layer and reducing the threshold current of the laser. Also the InP cladding layer is formed in a ridge shape with the portion near the base thereof being splayed like a skirt, thereby keeping the p-type metal electrode from the light emitting region and suppressing the absorption loss of light due to the p-type metal electrode. Further, by increasing the resistance of the active layers in the region that interposes a main current path, parasitic capacitance formed by the active layer in the region where current does not flow can be decreased thereby improving the high-frequency characteristic of the laser.

11 Claims, 34 Drawing Sheets

Prior Art

SEMICONDUCTOR LASER ELEMENT

BACKGROUND OF THE INVENTION

1. Filed of the Invention

The present invention relates to a ridge waveguide semiconductor laser and, more particularly, to improvements in the optical output characteristic and high-frequency characteristic of a ridge waveguide semiconductor laser based on AlGaInAs/InP semiconductor material.

2. Description of the Related Art

The AlGaInAs/InP laser which has good temperature characteristic, is lately viewed as a promising element as the semiconductor laser used in communications based on optical fibers. FIG. 18 is a sectional view showing an example of the AlGaInAs/InP laser of the prior art. It is difficult to make the AlGaInAs/InP laser in an embedded structure since Al is included in the active layer as shown in FIG. 18. Therefore, a ridge waveguide configuration is generally employed. In FIG. 18, numeral 1 denotes an n-type InP substrate, 2 denotes an n-type InP cladding layer, 3 denotes an n-type AlInAs cladding layer, 4 denotes an n-type AlGaInAs light confinement layer, 5 denotes an AlGaInAs quantum well layer, 6 denotes a p-type AlGaInAs light confinement layer, 7 denotes a p-type AlInAs cladding layer, 10b denotes a p-type InP residue layer, 10a denotes a ridge portion comprising the p-type InP layer, 11 denotes a p-type InGaAs contact layer, 12 denotes an SiO$_2$ insulation layer, 13 denotes a p-type electrode (Au) of the laser, and 14 denotes an n-type electrode (Au/Ge/Ni/Au).

The ridge waveguide semiconductor laser shown in FIG. 18 has been produced in the process shown in FIGS. 19A through 19F in the prior art. First, for example, the MOCVD method is employed to form the n-type InP cladding layer 2, the n-type AlInAs cladding layer 3, the n-type AlGaInAs light confinement layer 4, the AlGaInAs quantum well layer 5, the p-type AlGaInAs light confinement layer 6, the p-type AlInAs cladding layer 7, and the p-type InP layer 10 and the p-type InGaAs contact layer 11, laminated successively on the n-type InP substrate 1 as shown in FIG. 19A.

Then, as shown in FIG. 19B, a SiO$_2$ insulating layer 20 is formed that is etched away in a photolithography process while leaving a portion where a ridge is to be formed. The SiO$_2$, insulating layer 20 is used as a mask in dry etching or wet etching of the p-type InGaAs contact layer 11, and the p-type InP layer 10 is partially etched away leaving a part of the thickness, thereby forming the ridge portion 10a and the residue layer 10b of the InP layer 10 as shown in FIG. 19C.

Then as shown in FIG. 19D, the SiO$_2$ insulating layer 20 is removed by etching followed by the formation of the SiO$_2$ insulating layer 12, and only the portion on top of the ridge 10a is etched away in the photolithography process shown in FIG. 19E. Then the p-type electrode 13 and the n-type electrode 14 of the laser are formed as shown in FIG. 19F.

In the production process described above, since the depth of etching of the p-type InP layer 10 is governed by time, depth of etching is likely to vary among lots, among wafers and among positions in the wafer surfaces. Consequently, there have been significant variations in the semiconductor laser characteristics among lots, among wafers and among positions in the wafer surface.

Variations in the semiconductor laser characteristics caused by the variations in the depth of etching are as follows. In case the p-type InP layer 10 is etched to a small depth, current 22 flowing beside the ridge increases, resulting in an increase in the threshold current, as shown in FIG. 20A. Also because a light emitting region 23 expands, the angle of spread of light in the horizontal direction decreases. In case the p-type InP layer 10 is etched to a greater depth, on the other hand, the current 22 flowing beside the ridge decreases, resulting in a decrease in the threshold current. Also because the light emitting region 23 becomes narrower, the angle of spread of light in the horizontal direction increases.

To restrict variations in the depth of etching of the p-type InP layer 10, Japanese Laid-Open Patent Publication No. 11-54837 discloses a method wherein a p-type GaInAsP etching, stopping layer 9 is provided below the InP layer 10 as shown in FIGS. 21A and 21B. The p-type GaInAsP etching stopping layer 9 is not etched by common etchants that are used in wet etching of the InP layer 10. Therefore, depth of etching of the InP layer can be kept constant by stopping the etching of the InP layer 10 at the GaInAsP etching stopping layer when the GaInAsP etching stopping layer is provided below the InP layer 10.

However, the AlGaInAs/InP laser of the prior art has the following problems.

First, as described in the Japanese Laid-Open Patent Publication No. 11-54837, in case the p-type GaInAsP etching stopper layer is provided on the p-type AlInAs cladding layer, the energy band at the junction of the p-type AlInAs layer and the p-type InGaAsP etching stopping layer has a discontinuous structure, so serial resistance becomes higher and the threshold current of the laser increases. As described in the Japanese Laid-Open Patent Publication No. 11-54837, the serial resistance can be decreased to some extent by optimizing the composition of the InGaAsP etching stopper layer, although it is not possible to completely suppress the increase in the serial resistance due to the discontinuous band structure even if this method is employed.

Light emitted from the AlGaInAs active layer 5 of the AlGaInAs/InP laser is spread around the light emitting region 23. In the conventional laser structure, the spread of light reaches the p-type electrode 13 as shown in FIG. 4A. The metal of the p-type electrode has a very high absorption coefficient for light of wavelengths in a range from 1.3 to 1.55 $\mu$m that are the wavelengths of light emitted by the AlGaInAs/InP semiconductor laser. As a result, there occurs an absorption loss due to the p-type electrode which, in turn, causes an increase in the threshold current and a decrease in the light emission efficiency of the laser, thus deteriorating the laser characteristics.

Moreover, since a PN junction region (a region where the p-type layer and the n-type layer adjoin each other: the AlGaInAs quantum well layer 5 in the case of this example) expands laterally to portions where current does not flow, there has been a poor high-frequency characteristic of the semiconductor laser. This problem will be described below with reference to FIG. 22. FIG. 22 is a schematic diagram showing an equivalent circuit of the ridge waveguide semiconductor laser of the prior art. Current supplied through the p-type electrode 13 flows through a resistor 25 consisting of the p-type cladding layer 10, a diode 26 consisting of the quantum well layer 5 and a resistor 27 consisting of the n-type cladding layer 2, and enters the n-type electrode 14. A parasitic capacitance is parallel to the main current path, and causes deterioration in the high-frequency characteristic of the laser. The parasitic capacitance consists mainly of a capacitance 28 formed by the SiO$_2$ insulating layer 12 in a pad portion and a capacitance 29 formed by the PN junction of the AlGaInAs quantum well layer 5 in a region where current does not flow. The capacitance 29 formed by the PN junction is far larger than the capacitance 28 of the pad. Since these components of capacitance are connected in series, total amount of the parasitic capacitance is determined by the capacitance 28 of the pad that has the smaller value. Consequently, roughly speaking, the capacitance 29 formed by the PN junction has a relatively small effect on the high-frequency characteristic of the laser. However, since the capacitance 29 formed by the PN junction is connected to the main current path via the p-type AlInAs cladding layer 7 (which constitutes a resistor component), the smaller the resistance of the p-type AlInAs cladding layer 7, the greater the effect of the capacitance 29 formed by the PN junction, and the lower the high-frequency characteristic.

SUMMARY OF THE INVENTION

The present invention has been made to solve the problems described above, and an object thereof is to provide a ridge waveguide semiconductor laser that is excellent in the optical output characteristic and high-frequency characteristic by reducing the threshold current of the laser and suppressing the influence of the parasitic capacitance caused by the PN junction region.

According to the first aspect of the present invention, a ridge waveguide semiconductor laser comprises:

a first conductivity type InP substrate;

a first conductivity type cladding layer of $Al_xGa_yIn_{1-x-y}As$ ($0<x$, $0 \leq y$, $x+y<1$) formed above said InP substrate;

an active layer of $Al_{x1}Ga_{y1}In_{1-x1-y1}As$ ($0<x_1$, $0 \leq y_1$, $x_1+y_1<1$) formed above said first conductivity type cladding layer, a second conductivity type cladding layer of $Al_{x2}Ga_{y2}In_{1-x2-y2}As$ ($0<x_2$, $0 \leq y_2$, $x_2+y_2<1$) formed above said active layer; and a first InP cladding layer of the second conductivity type formed above said second conductivity type cladding layer;

an etching stopper layer formed above said first InP cladding layer; and a second InP cladding layer of the second conductivity type formed above said etching stopper layer, said second InP cladding layer having a ridge shape.

Since the InP cladding layer of the second conductivity type is formed via the etching stopper layer, there are less variations in the depth of etching when forming the ridge of the InP cladding layer of the second conductivity type. Moreover, since the etching stopper layer is formed over the $Al_{x2}Ga_{y2}In_{1-x2-y2}As$ cladding layer via the InP layer, there occurs no problem of series resistance due to the discontinuous band structure between the etching stopper layer and the $Al_{x2}Ga_{y2}In_{1-x2-y2}As$ cladding layer. As a result, variations in the threshold current and in the angle of horizontal spread of light among lots, among wafers and among positions in the wafer surface are restricted and it is made possible to provide a ridge waveguide semiconductor laser having reduced threshold current and excellent optical output characteristic.

The etching stopper layer of the second conductivity type is preferably formed from $In_aGa_{1-a}As_bP_{1-b}$ ($0<a<1$, $0<b<1$). The etching stopper layer made of $In_aGa_{1-a}As_bP_{1-b}$ has better crystallinity, when formed on the InP layer, than when formed directly on the $Al_{x2}Ga_{y2}In_{1-x2-y2}As$ cladding layer. The better the crystallinity is, the better a function to stop the etching step becomes.

A method of producing the ridge waveguide semiconductor laser according to the first aspect of the present invention comprises the steps of:

(a) forming said first InP cladding layer on said second conductivity type cladding layer;

(b) forming said etching stopper layer on said first InP cladding layer;

(c) forming said second InP cladding layer on said etching stopper layer;

(d) etching said second InP cladding layer by dry-etching vertically downward midway in the thickness thereof, while leaving a region where the ridge is to be formed; and (e) etching said second InP cladding layer further vertically down to said etching stopper layer using an acid mixture including hydrochloric acid and phosphoric acid, thereby forming the ridge shape.

Use of the acid mixture including hydrochloric acid and phosphoric acid in the etching of the InP layer of the second conductivity type makes it possible to stop the etching step at the etching stopper layer, because of great difference in the selective etching rate between the InP layer and the etching stopper layer such as $Al_{x2}Ga_{y2}In_{1-x2-y2}As$ ($0<x_2$, $0 \leq y_2$, $x_2+y_2<1$) (the InP layer is etched at a high rate while the $Al_{x2}Ga_{y2}In_{1-x2-y2}As$ layer is etched at a very low rate). Therefore, variations in the depth of etching the InP cladding layer among lots, among wafers and among positions in the wafer surface can be eliminated by setting the duration of etching longer than the average time required to completely etch away the p-type InP layer. Also because etching with the acid mixture of hydrochloric acid and phosphoric acid proceeds only downward through the substrate in the last stage without hardly proceeding in the lateral direction, the InP layer can be etched vertically downward thereby to form a vertical side faces of the ridge.

According to a second aspect of the present invention, a ridge waveguide semiconductor laser comprises:

a first conductivity type InP substrate;

a first conductivity type cladding layer of $Al_xGa_yIn_{1-x-y}As$ ($0<x$, $0 \leq y$, $x+y<1$) formed above said InP substrate;

an active layer of $Al_{x1}Ga_{y1}In_{1-x1-y1}As$ ($0<x_1$, $0 \leq y_1$, $x_1+y_1<1$) formed above said first conductivity type cladding layer, a second conductivity type cladding layer of $Al_{x2}Ga_{y2}In_{1-x2-y2}As$ ($0<x_2$, $0 \leq y_2$, $x_2+y_2<1$) formed above said active layer;

an InP cladding layer of the second conductivity type formed above said second conductivity type cladding layer, wherein said InP cladding layer has a ridge shape splayed like a skirt near the base; and a metal electrode formed above said InP cladding layer, said metal electrode formed along the ridge of said InP cladding layer.

Forming the InP cladding layer in the ridge shape having the portion near the base splayed like a skirt makes it possible to keep the metal electrode from the light emitting region and restrict the absorption of light by the metal electrode. As a result, the ridge waveguide semiconductor laser having a high external quantum efficiency can be provided. The reason for splaying only the portion near the base of the ridge for keeping the metal electrode is that splaying the entire side face of the ridge into a simple trapezoidal shape results in smaller area on top of the ridge that would increase the contact resistance between the metal electrode and the cladding layer (or the contact layer).

A method of producing the ridge waveguide semiconductor laser according to the second aspect of the present invention comprises the steps of:

(a) forming said InP cladding layer on said second conductivity type cladding layer of $Al_{x2}Ga_{y2}In_{1-x2-y2}As$;

(b) etching said InP cladding layer by dry etching vertically downward midway in the thickness thereof, leaving a region where the ridge is to be formed; and (c) etching said InP cladding layer obliquely toward said second conductivity type cladding layer of $Al_{x2}Ga_{y2}In_{1-x2-y2}As$ using an acid mixture including hydrochloric acid and phosphoric acid.

The InP layer can be formed into a skirt shape splayed downward in the portion near the base by applying dry etching midway through the InP cladding layer and etching the remainder further with the mixture of hydrochloric acid and phosphoric acid. While a vertical side face is finally formed when the InP is etched with the mixture of hydrochloric acid and phosphoric acid, increasing the proportion of hydrochloric acid in the mixture (for example, 1:1 for hydrochloric acid and phosphoric acid) causes, first, a sloped side face to be etched and then a vertical side face to be formed. Consequently, sloping etched side face can be formed to make the p-type InP layer of a splayed configuration, by increasing the proportion of hydrochloric acid and properly controlling the etching time.

According to the third aspect of the present invention, a ridge waveguide semiconductor laser comprises:

a first conductivity type InP substrate;

a first conductivity type cladding layer of $Al_xGa_yIn_{1-x-y}As$ ($0<x$, $0 \leq y$, $x+y<1$) formed above said InP substrate;

an active layer of $Al_{x1}Ga_{y1}In_{1-x1-y1}As$ ($0<x_1$, $0 \leq y_1$, $x_1+y_1<1$) formed above said first conductivity type cladding layer, wherein said active layer has a high resistance region interposing a main current path in said active layer;

a second conductivity type cladding layer of $Al_{x2}Ga_{y2}In_{1-x2-y2}As$ ($0<x_2$, $0 \leq y_2$, $x_2+y_2<1$) formed above said active layer;

an InP cladding layer of the second conductivity type formed above said second conductivity type cladding layer, said InP cladding layer having a ridge shape; and a metal electrode formed above said InP cladding layer.

By increasing the resistance of the active layer in a region interposing the main current path, it is made possible to decrease the parasitic capacitance formed by the PN junction of the active layer where current does not flow. Thus the ridge waveguide semiconductor laser of excellent high-frequency characteristic can be provided.

Further in the ridge waveguide semiconductor laser of the third invention, increasing the resistance of the $Al_{x2}Ga_{y2}In_{1-x2-y2}As$ cladding layer of the second conductivity type in region interposing the main current path in the $Al_{x2}Ga_{y2}In_{1-x2-y2}As$ cladding layer of the second conductivity type makes it possible to increase the junction resistance between the parasitic capacitance formed by the PN junction and the current path, thereby further improving the high-frequency characteristic of the ridge waveguide semiconductor laser.

The region of the $Al_{x1}Ga_{y1}In_{1-x1-y1}As$ active layer of which resistance is increased is preferably the region that interpose the portion of the InP cladding layer of the second conductivity type right below the ridge. This configuration makes it possible to increase the resistance of the $Al_{x1}Ga_{y1}In_{1-x1-y1}As$ active layer by using the ridge portion of the InP cladding layer as a mask.

However, since the high resistance region of the $Al_{x1}Ga_{y1}In_{1-x1-y1}As$ active layer has a high absorption coefficient of light, the high resistance region may decrease the effective optical output when located near the light emitting region. In order to avoid this problem, when the resistance of the $Al_{x1}Ga_{y1}In_{1-x1-y1}As$ active layer is increased in the region that interpose the portion of the InP cladding layer of the second conductivity type right below the ridge, it is preferable to form the InP cladding layer of the second conductivity type in a ridge shape with the portion near the base splayed like a skirt. This configuration makes it possible to decrease the overlapping area between the light emitting region and the high resistance region of the active layer, thereby decreasing the absorption loss of light. Also when the metal electrode is formed along the ridge of the InP cladding layer of the second conductivity type, absorption loss of light due to the metal electrode can also be decreased, thereby improving the external quantum efficiency of the laser.

Also in order to further restrict the absorption of effective light in the high resistance region, the high resistance region of the $Al_{x1}Ga_{y1}In_{1-x1-y1}As$ active layer may be located apart from the area right below the ridge. This constitution has such an advantage as the high resistance region can be kept away from the light emitting region thereby eliminating the absorption loss of light, thereby improving the external quantum efficiency of the laser, although this configuration requires a somewhat complicated process to increase the resistance.

However, keeping the high resistance region of the active region away from the area right below the ridge, it is likely for the threshold current to increase due to the current flowing on both sides of the ridge. In order to suppress the threshold current increment, it is further preferable to increase the resistance of the $Al_{x2}Ga_{y2}In_{1-x2-y2}As$ cladding layer of the second conductivity type in the region that interposes the portion of the InP cladding layer of the second conductivity type right below the ridge. By increasing the resistance of the $Al_{x2}Ga_{y2}In_{1-x2-y2}As$ cladding layer of the second conductivity type beside the ridge, the spread of current flowing below the ridge is restricted, thereby decreasing the threshold current of the laser.

A method of producing the ridge waveguide semiconductor laser according to the third aspect of the present invention comprises the steps of:

(a) forming said second conductivity type cladding layer of $Al_{x2}Ga_{y2}In_{1-x2-y2}As$ on said active layer;

(b) forming said InP cladding layer on said second conductivity type cladding layer;

(c) forming said InP cladding layer in a ridge shape having the portion near the base thereof splayed like a skirt; and (d) increasing the resistance of said active layer by using said InP cladding layer as a mask.

By carrying out such processes as ion injection into the $Al_{x1}Ga_{y1}In_{1-x1-y1}As$ active layer by using the InP layer of ridge shape as the mask, it is made possible to increase the resistance of the $Al_{x1}Ga_{y1}In_{1-x1-y1}As$ active layer in a simple process. Also because the InP layer used as the mask has the ridge shape splayed downward, it is made possible to decrease the overlapping area between the light emitting region and the high resistance region, thereby decreasing the absorption loss of light due to the high resistance region.

In this patent specification, "first conductivity type" and "second conductivity type" refer to different types of conductivity, p type or n type. When the first conductivity type is n type, the second conductivity type is p type and, when the first conductivity type is p type, the second conductivity type is n type.

DETAILED DESCRIPTION OF THE PREFERRED EMBODIMENTS

This application is based on application No. 2000-39250 filed in Japan, the content of which is incorporated herein by reference.

Embodiment 1

Figure 1:
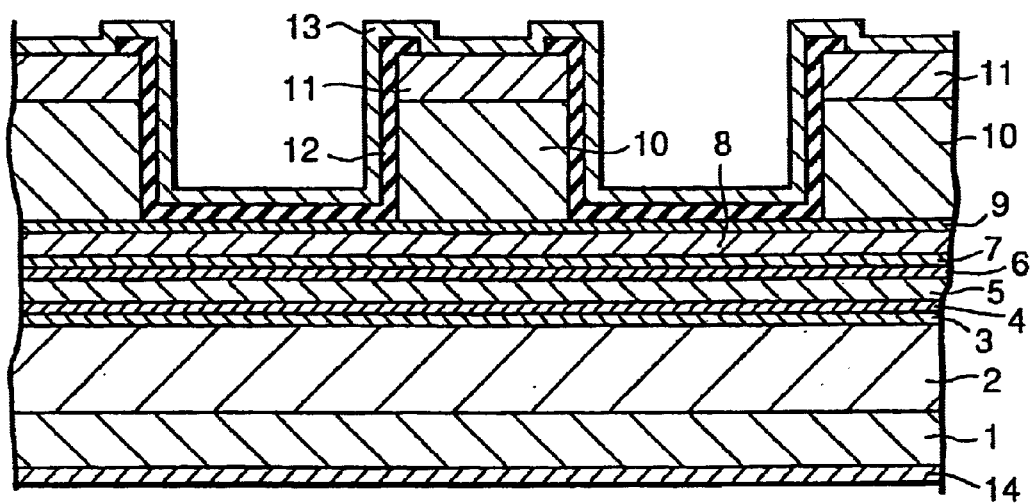
FIG. 1 is a sectional view showing a ridge waveguide semiconductor laser according to the first embodiment of the present invention.

FIG. 1 is a sectional view showing a ridge waveguide semiconductor laser based on AlGaInAs/InP semiconductor according to the first embodiment of the present invention. In FIG. 1, numeral 1 denotes an n-type InP substrate, 2 denotes an n-type InP cladding layer (thickness 1 $\mu$m, carrier concentration $N=1\times10^{18}$ cm$^{-3}$), 3 denotes an n-type AlInAs cladding layer (thickness 0.1 $\mu$m, carrier concentration $N=1\times10^{18}$ cm$^{-3}$), 4 denotes an n-type AlGaInAs light confinement layer (thickness 0.1 $\mu$m, carrier concentration $N=1\times10^{18}$ cm$^{-3}$), 5 denotes an AlGaInAs quantum well layer, 6 denotes a p-type AlGaInAs light confinement layer (thickness 0.1 $\mu$m, carrier concentration $N=1\times10^{18}$ cm$^{-3}$), 7 denotes a p-type AlInAs cladding layer (thickness 0.1 $\mu$m, carrier concentration $N=1\times10^{18}$ cm$^{-3}$), 8 denotes an p-type InP residue layer (thickness 0.1 $\mu$m, carrier concentration $N=1\times10^{18}$ cm$^{-3}$), 9 denotes a p-type InGaAsP etching stopper layer (thickness 0.05 $\mu$m, carrier concentration $N=1\times10^{18}$ cm$^{-3}$), 10 denotes a ridge portion comprising a p-type InP layer (thickness 1.5 $\mu$m, carrier concentration $N=1\times10^{18}$ cm$^{-3}$), 11 denotes a p-type InGaAs contact layer (thickness 0.1 $\mu$m, carrier concentration $N=1\times10^{19}$ cm$^{-3}$), 12 denotes an SiO$_2$ insulation layer, 13 denotes a p-type electrode (Au) of the laser and 14 denotes an n-type electrode (Au/Ge/Ni/Au).

According to the present invention, since the InP residue layer 8 is formed between the p-type InGaAsP etching stopper layer 9 and the p-type AlInAs cladding layer 7, an increase in the series resistance due to the discontinuity of band between the etching stopper layer and the cladding layer is restricted. Also because crystallinity of the p-type InGaAsP etching stopper layer 9 is improved by growing the p-type InGaAsP etching stopper layer 9 on the InP layer 8, the function of the etching stopper layer 9 to stop the etching step is also improved. The etching stopper layer 9 may also be made of a material other than InGaAsP such as AlGaInAs.

Figure 2A:
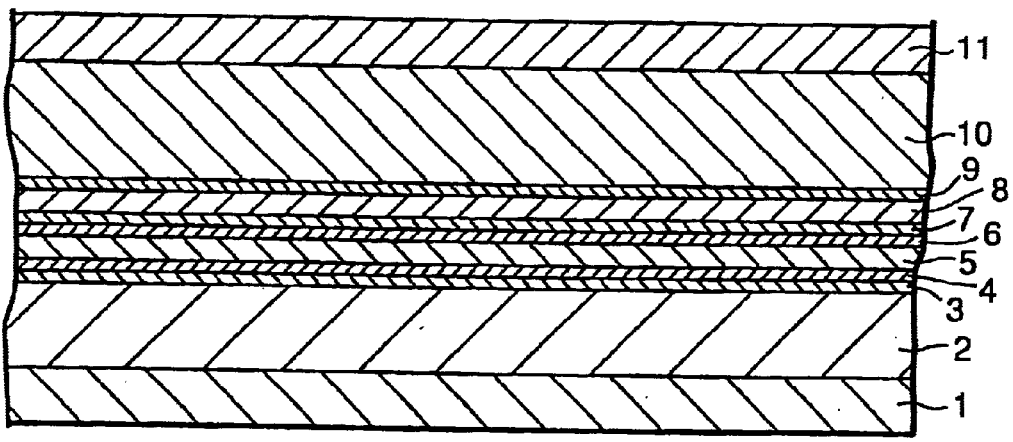
FIGS. 2A through 2F show a process of producing the ridge waveguide semiconductor laser according to the first embodiment of the present invention.

FIGS. 2A through 2F show a process of producing the ridge waveguide laser shown in FIG. 1. First, as shown in FIG. 2A, the n-type InP cladding layer 2, the n-type AlInAs cladding layer 3, the n-type AlGaInAs light confinement layer 4, the AlGaInAs quantum well layer 5, the p-type AlGaInAs light confinement layer,6, the p-type AlInAs cladding layer 7, the p-type InP layer 8, the p-type InGaAsP etching stopper layer 9, the p-type InP layer 10 and the p-type InGaAs contact layer 11 are grown one on another on the n-type InP substrate 1 by, for example, the MOCVD process.

Figure 2B:
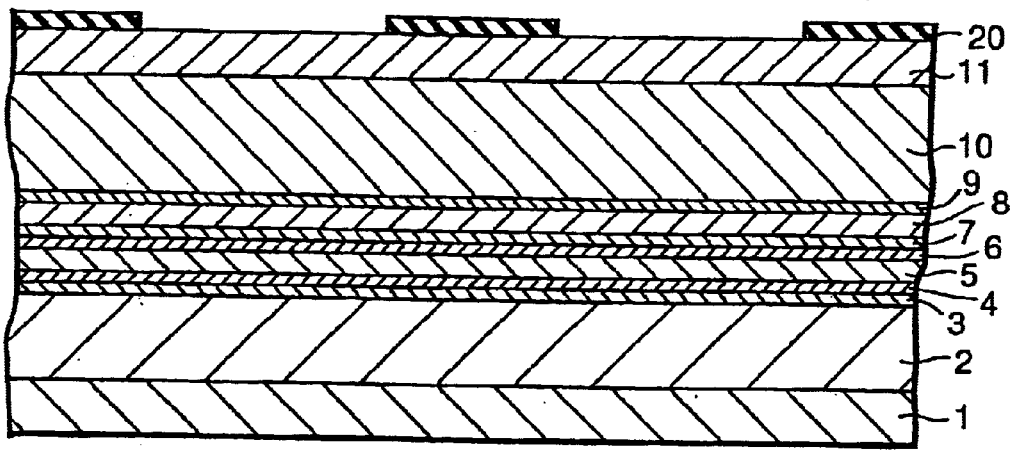
Figure 2C:
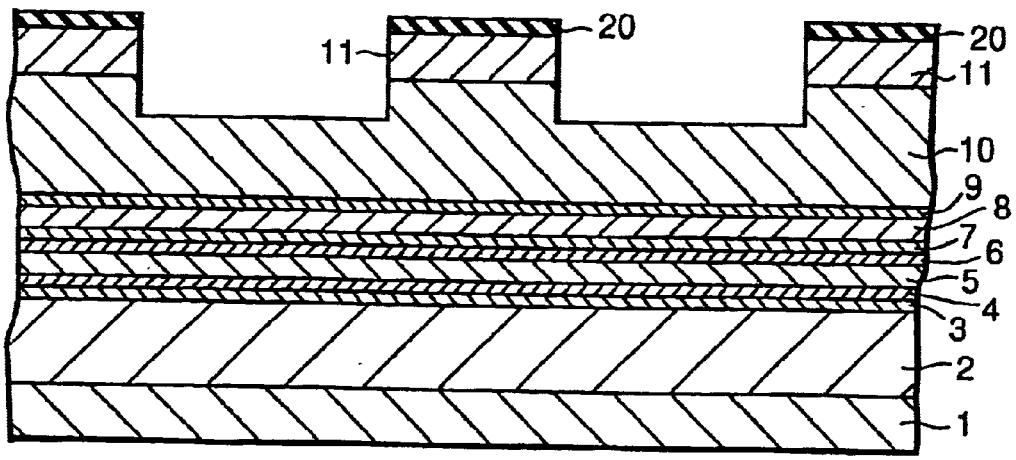

Then as shown in FIG. 2B, an $SiO_2$ insulation layer 20 is formed and is then removed by etching in the photolithography process while leaving a region where the ridge is to be formed. Then as shown in FIG. 2C, using the $SiO_2$ insulation layer 20 as a mask, the p-type InGaAs contact layer is completely etched away and the p-type InP layer 10 is etched midway by dry etching.

Figure 2D:
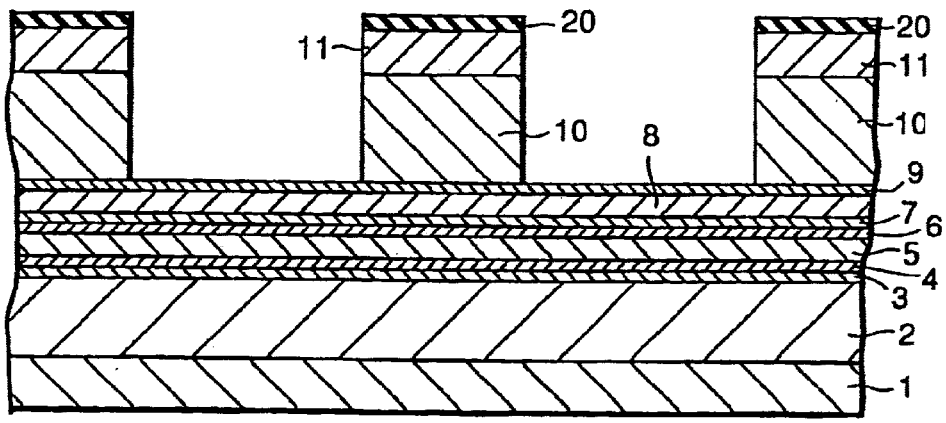

Then as shown in FIG. 2D, the p-type InP layer 10 is completely etched in wet etching, with the etching step being stopped at the InGaAsP etching stopper layer 9. For the wet etching solution, a mixture of hydrochloric acid and phosphoric acid (volume proportion of 1:2) may be used that makes it possible to stop the etching step at the p-type InGaAsP etching stopper layer 9 because of great difference in the selective etching rate between the InP layer and the InGaAsP layer (the InP layer is etched at a high rate while the InGaAsP layer is etched at a very low rate). Using the mixture of hydrochloric acid and phosphoric acid with long etching duration, the etching proceeds only downward and hardly proceeds in the lateral direction. As a result, a vertical ridge can be formed. In this process, duration of etching with the mixture of hydrochloric acid and phosphoric acid is preferably set long so that the p-type InP layer 10 can be completely etched away. Since the etching step stops at the InGaAsP etching stopper layer 9, there occur no variations in the depth of etching the InP cladding layer among lots, among wafers and among positions in the wafer surface. As a result, there occur no variations in the thickness of the p-type InP residue layer 8 among lots, among wafers and among positions in the wafer surface.

Figure 2E:
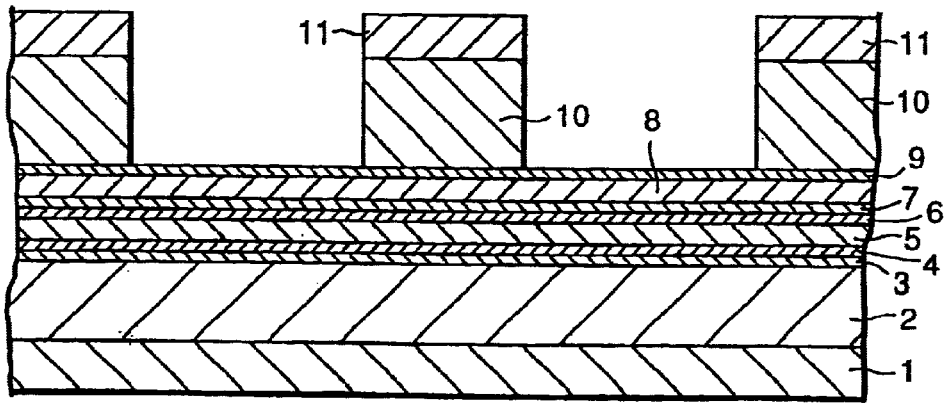
Figure 2F:
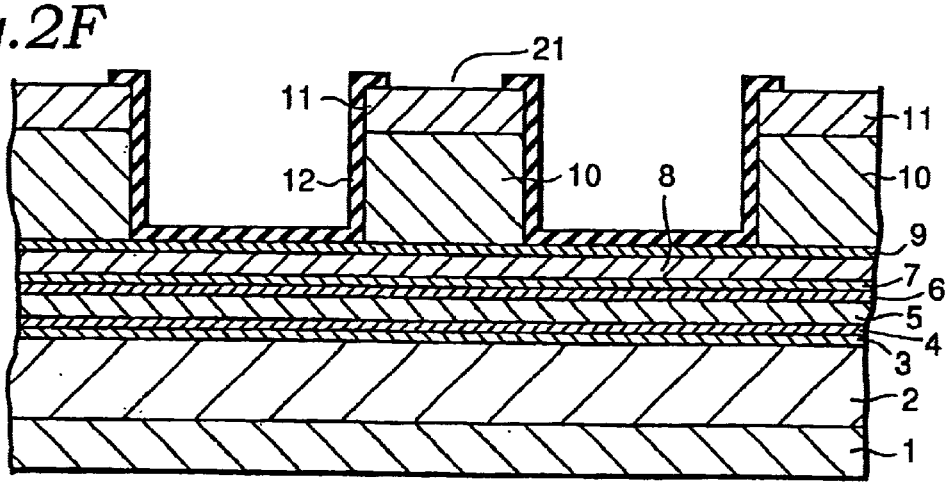

Then the $SiO_2$ insulation layer 20 is removed by etching as shown in FIG. 2E. The $SiO_2$ insulation layer 12 is formed except the portion on top of the ridge 10 as shown in FIG. 2F. By forming the p-type electrode 13 and the n-type electrode 14 of the laser, the ridge waveguide semiconductor laser shown in FIG. 1 is completed.

Embodiment 2

Figure 3:
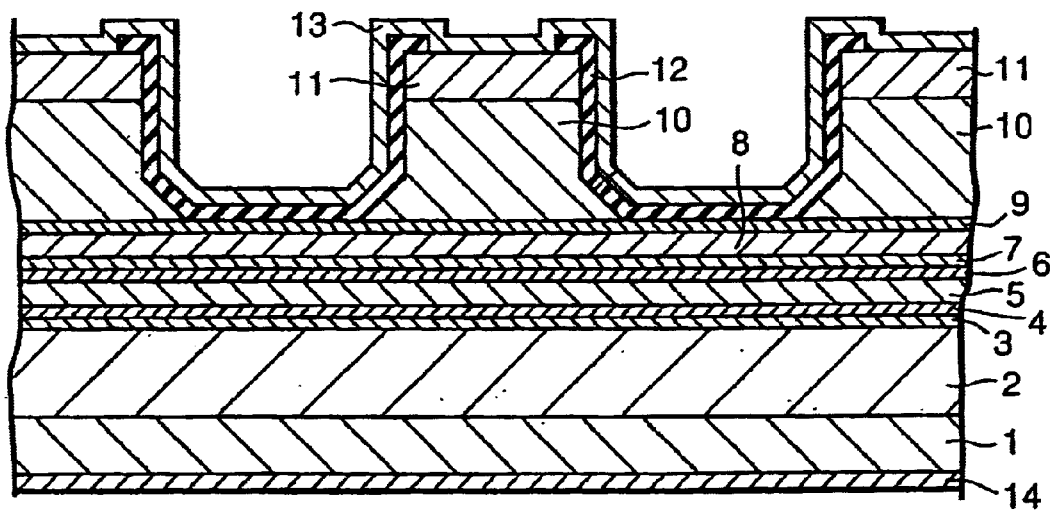
FIG. 3 is a sectional view showing a ridge waveguide semiconductor laser according to the second embodiment of the present invention.

FIG. 3 is a sectional view showing the ridge waveguide semiconductor laser according to the second embodiment of the present invention. The ridge waveguide semiconductor laser of this embodiment has a configuration similar to that of the first embodiment, except for a difference in the shape of the ridge 10. In this embodiment, as show in FIG. 3, the ridge 10 comprising the p-type InP layer (thickness 1.5 $\mu$m, carrier concentration N=$1\times10^{18}$ $^{cm-3}$) has a portion near the base thereof splayed like a skirt, while the p-type metal electrode 13 is formed along the ridge.

Figure 4A:
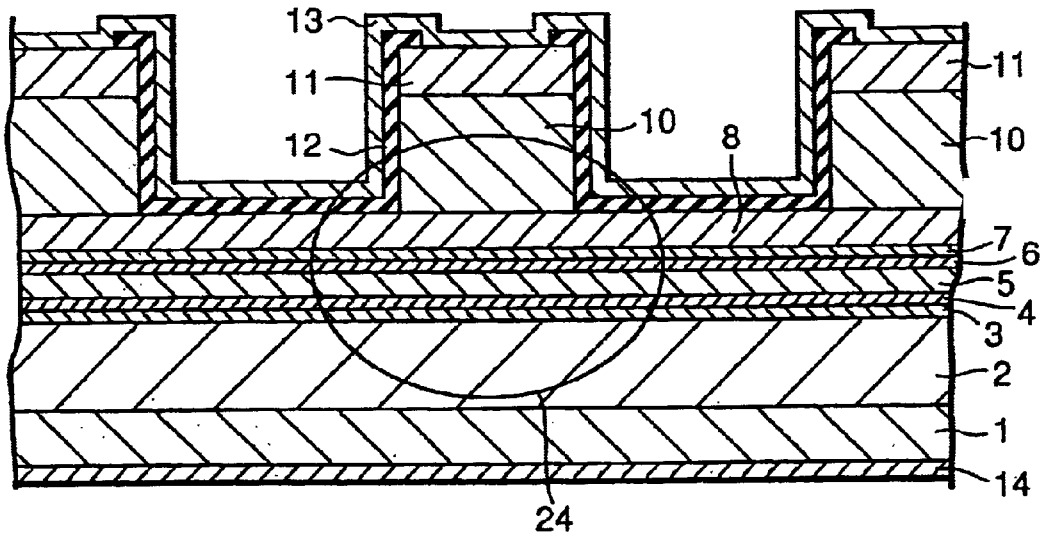
FIG. 4A shows the distribution of light in a ridge waveguide semiconductor laser of the prior art.

In the structure of the ridge waveguide semiconductor laser of the prior art, light emitting region 24 is spread to reach the p-type electrode (Ti/Au) 13 as shown in FIG. 4A. Since the metal that makes the electrode has a very high absorption coefficient for light of wavelengths in a range from 1.3 to 1.55 $\mu$m, absorption loss due to the electrode occurs resulting in increased threshold current and decreased efficiency of the laser, thus deteriorating the laser characteristic.

Figure 4B:
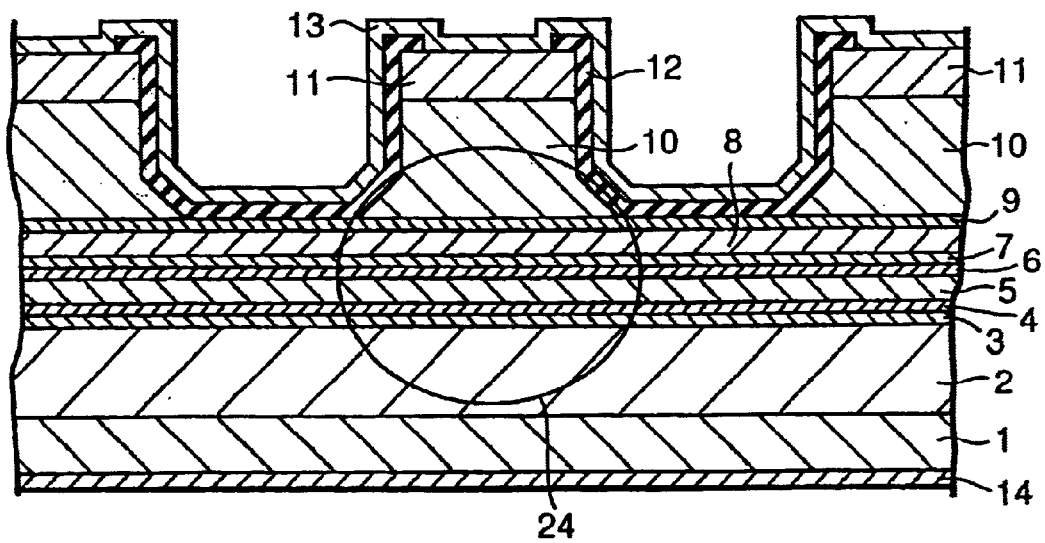
FIG. 4B shows the distribution of light in the ridge waveguide semiconductor laser of the second embodiment of the present invention.

According to the present invention, in contrast, since the ridge 10 has a configuration splayed downward, the light emitting region 24 does not spread to reach the p-type electrode (Ti/Au) 13 as shown in FIG. 4B. As a result, absorption loss due to the electrode does not occur, resulting in a threshold current that is lower than that of the conventional laser and higher efficiency, with improved laser characteristic.

Figure 5A:
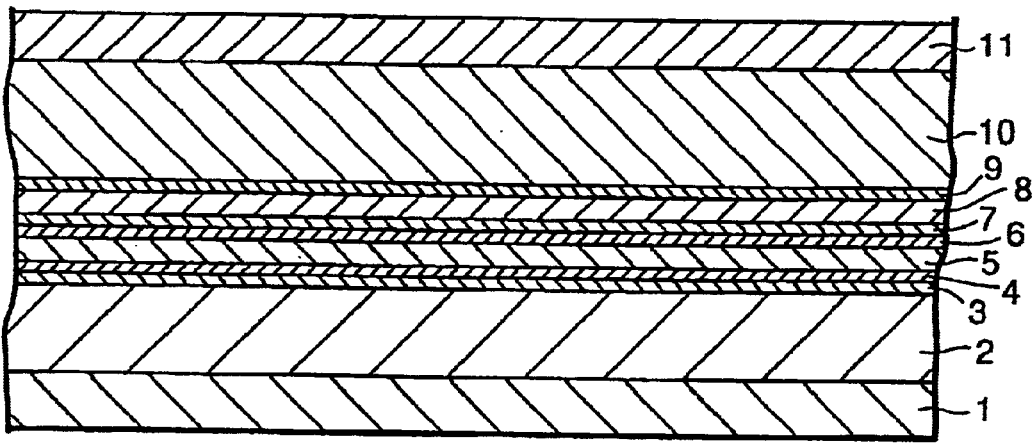
FIGS. 5A through 5F show a process of producing the ridge waveguide semiconductor laser according to the second embodiment of the present invention.

FIGS. 5A through 5F show a process of producing the ridge waveguide semiconductor laser of this embodiment. First, as shown in FIG. 5A, the n-type InP cladding layer 2, the n-type AlInAs cladding layer 3, the n-type AlGaInAs light confinement layer 4, the AlGaInAs quantum well layer 5, the p-type AlGaInAs light confinement layer 6, the p-type AlInAs cladding layer 7, the p-type InP residue layer 8, the p-type InGaAsP etching stopper layer 9, the p-type InP layer 10 and the p-type InGaAs contact layer 11 are grown one on another on the n-type InP substrate 1 by, for example, the MOCVD process.

Figure 5B:
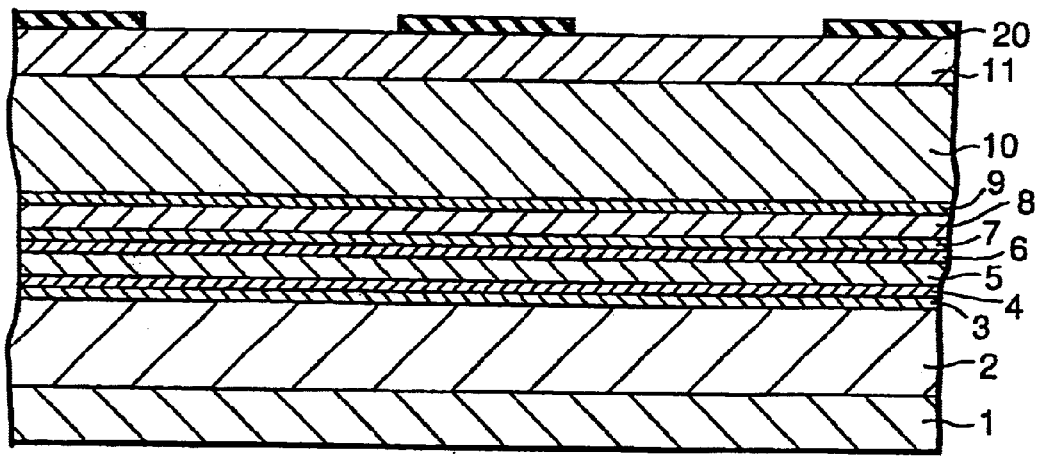
Figure 5C:
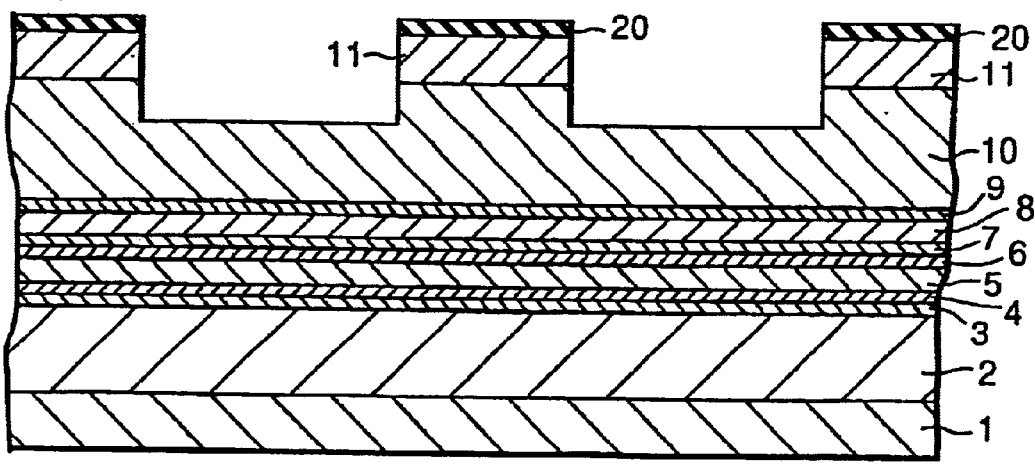

Then as shown in FIG. 5B, the $SiO_2$ insulation layer 20 is formed and is then removed by etching while leaving a region where the ridge is to be formed. Then as shown in FIG. 5C, the p-type InGaAs contact layer below the portion without the $SiO_2$ insulation layer 20 is completely etched away by dry etching using the $SiO_2$ insulation layer 20 as a mask, and the p-type InP layer 10 is etched midway.

Figure 5D:
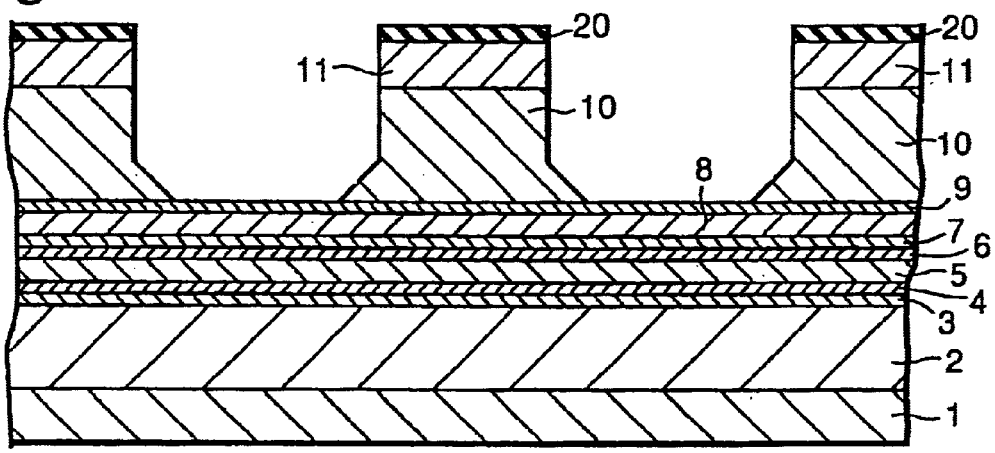

Then as shown in FIG. 5D, the p-type InP layer 10 is etched in wet etching, with the etching step being stopped at the InGaAsP etching stopper layer 9 so that a shape of being splayed toward the p-type AlInAs cladding layer 7 is obtained. For the wet etching solution, for example, a mixture of hydrochloric acid and phosphoric acid may be used. While vertically etched side face is formed at the end by etching the InP with the mixture of hydrochloric acid and phosphoric acid, increasing the proportion of hydrochloric acid in the mixture (for example, 1:1 for hydrochloric acid and phosphoric acid) causes, first, a sloped side face to be etched and then a vertical side face to be formed. Consequently, sloping etched side face can be formed to make the p-type InP layer 10 of a configuration splayed downward, by increasing the proportion of hydrochloric acid and properly controlling the etching time. In case the bottom surface of the InP substrate is (0,0,1) plane, the vertical side face of the ridge becomes (1,1, 0) plane and (1,1,1) B plane appears on the sloped side face. The side face of the ridge may also be oriented otherwise, for example, in the (1,1,0) plane. Even when the mixture of hydrochloric acid and phosphoric acid has a mix proportion of 1:1, great difference in the selective etching rate between the InP layer and the InGaAsP layer makes it possible to stop the etching step at the InGaAsP layer 9.

Figure 5E:
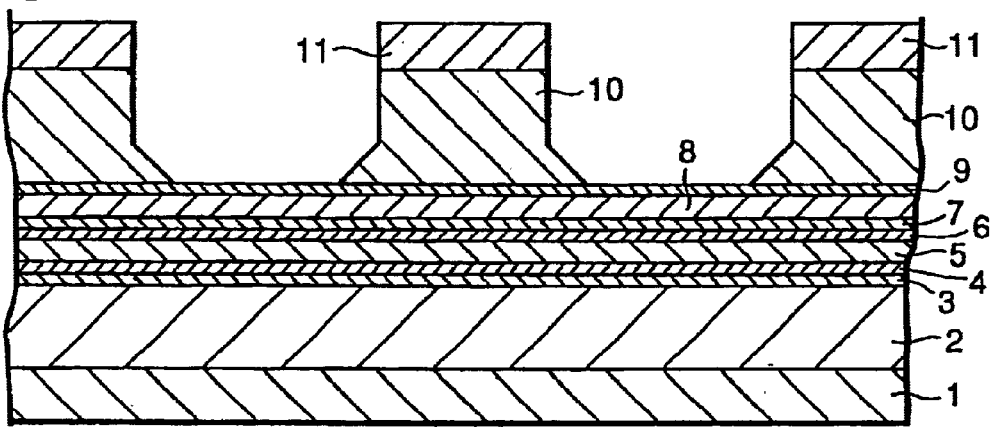
Figure 5F:
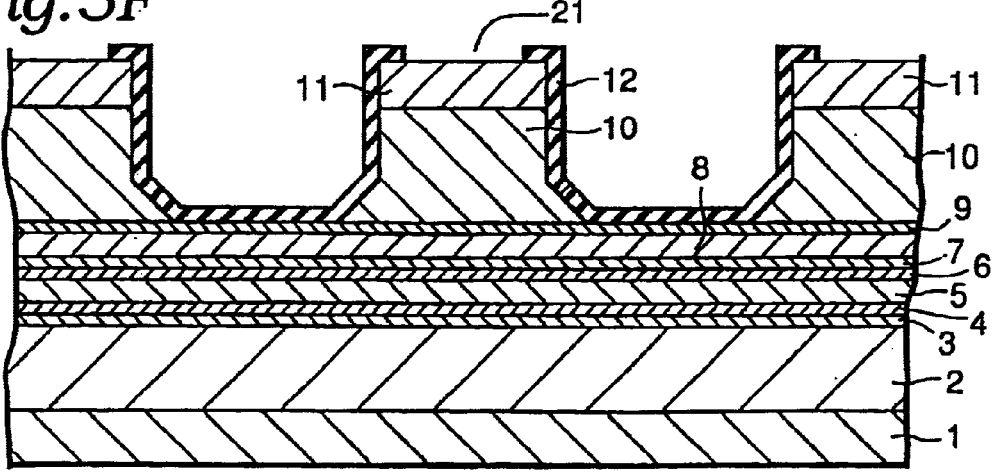

Then the $SiO_2$ insulation layer 20 is removed by etching as shown in FIG. 5E, and the $SiO_2$ insulation layer 12 is formed except the portion on top of the ridge 10 as shown in FIG. 5F. By forming the p-type electrode 13 and the n-type electrode 14 of the laser, the ridge waveguide semiconductor laser shown in FIG. 3 is completed.

Embodiment 3

Figure 6:
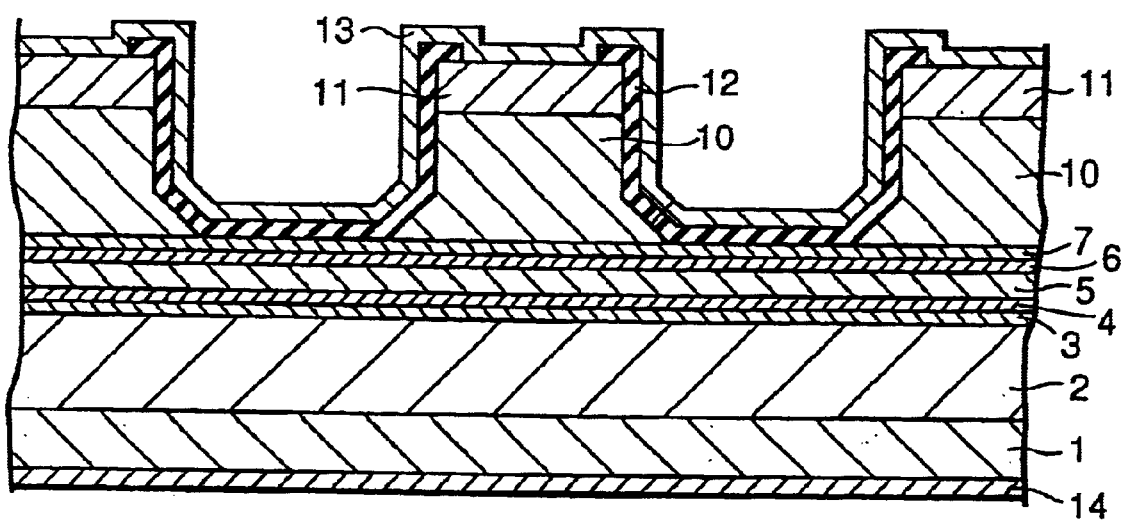
FIG. 6 is a sectional view showing a ridge waveguide semiconductor laser according to the third embodiment of the present invention.

FIG. 6 is a sectional view showing the ridge waveguide semiconductor laser according to the third embodiment of the invention. The ridge waveguide semiconductor laser of this embodiment has a configuration similar to that of the second embodiment, except that the ridge 10 is formed directly on the p-type AlInAs cladding layer 7.

Figure 7A:
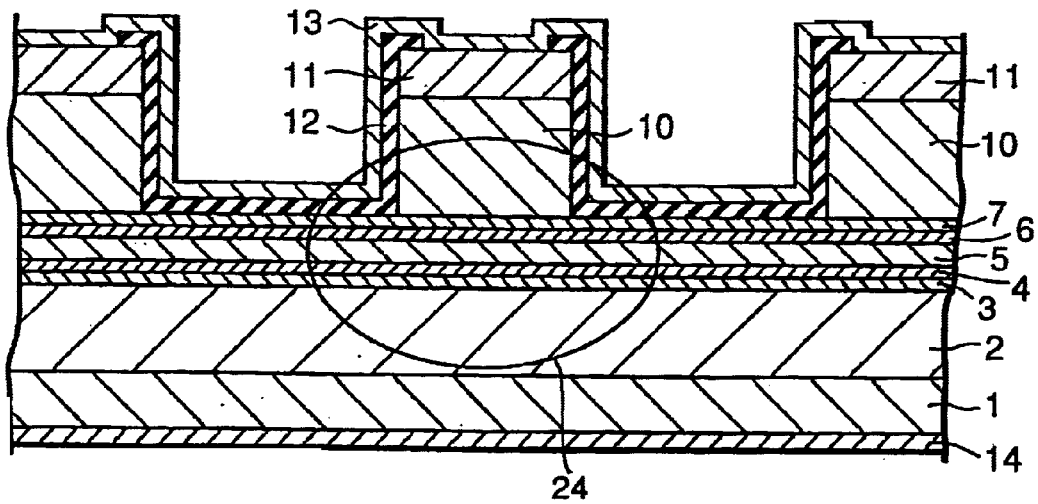
FIG. 7A shows the distribution of light in a ridge waveguide semiconductor laser of the, prior art.
Figure 7B:
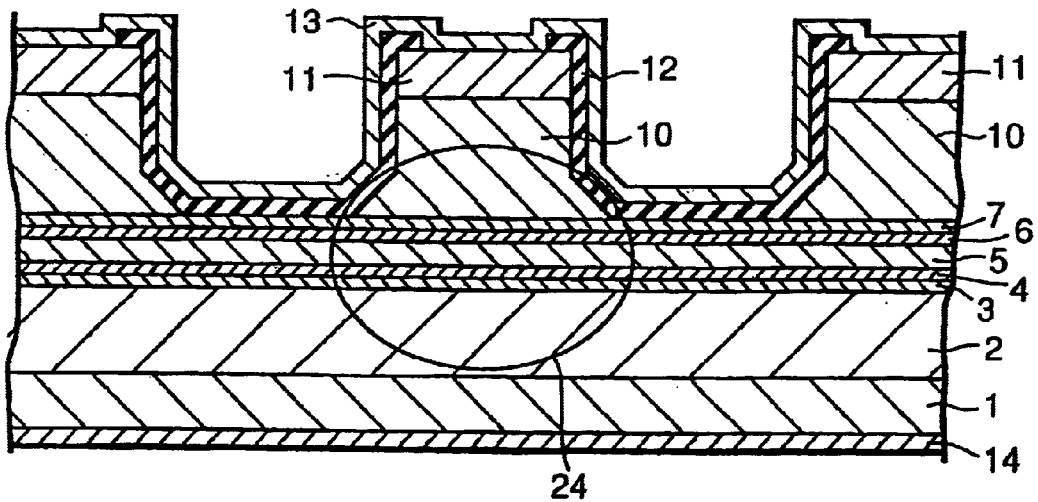
FIG. 7B shows the distribution of light in the ridge waveguide semiconductor laser of the third embodiment of the present invention.

In the structure of the ridge waveguide semiconductor laser of the prior art, there occurs light absorption loss due to the p-type electrode (Ti/Au) 13 as shown in FIG. 7A. According to this embodiment, the light absorption loss is suppressed, thereby decreasing the threshold current of the laser and increasing the light emission efficiency as shown in FIG. 7B.

FIGS. 8A through 8F, show a process of producing the ridge waveguide semiconductor laser of this embodiment.

Figure 8A:
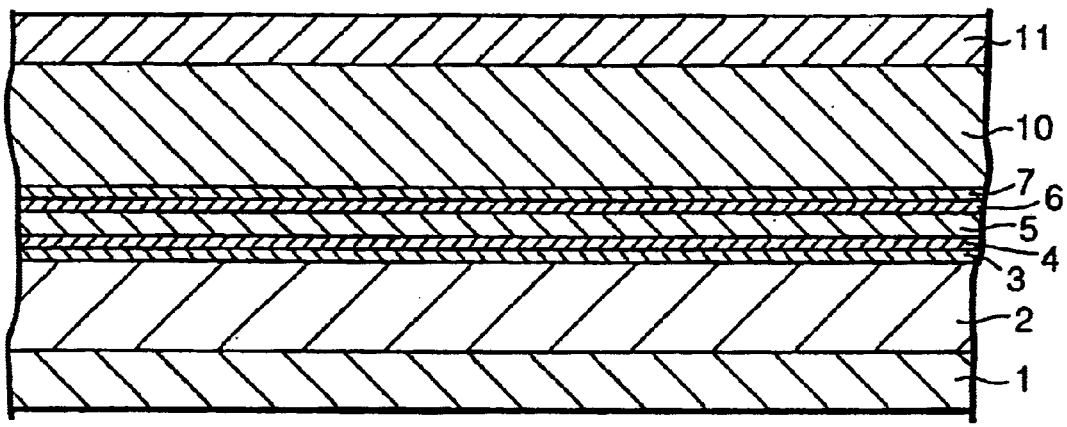
FIGS. 8A through 8F show a process of producing the ridge waveguide semiconductor laser according to the third embodiment of the present invention.

First, as shown in FIG. 8A, the n-type InP cladding layer 2, the n-type AlInAs cladding layer 3, the n-type AlGaInAs light confinement layer 4, the AlGaInAs quantum well layer 5, the p-type AlGaInAs light confinement layer 6, the p-type AlInAs cladding layer 7, the p-type InP layer 10 and the p-type InGaAs contact layer 11 are grown one on another on the n-type InP substrate 1 by, for example, the MOCVD process.

Figure 8B:
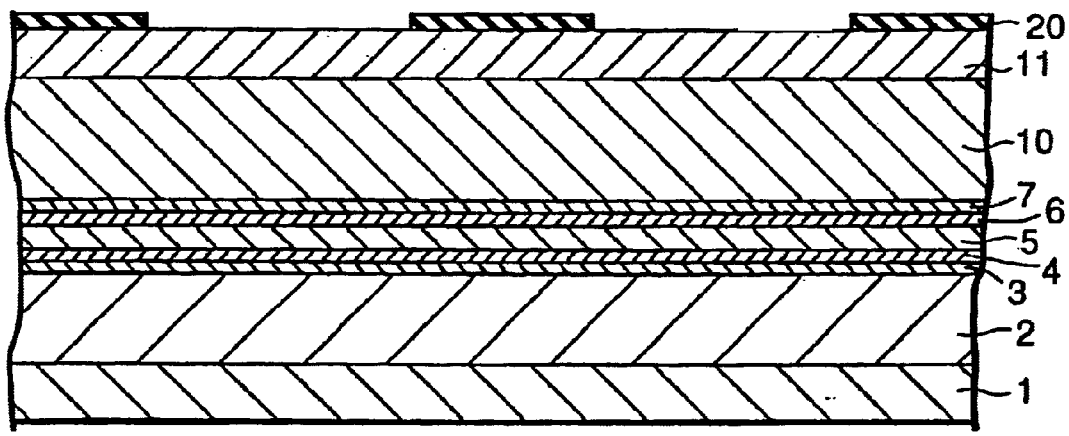
Figure 8C:
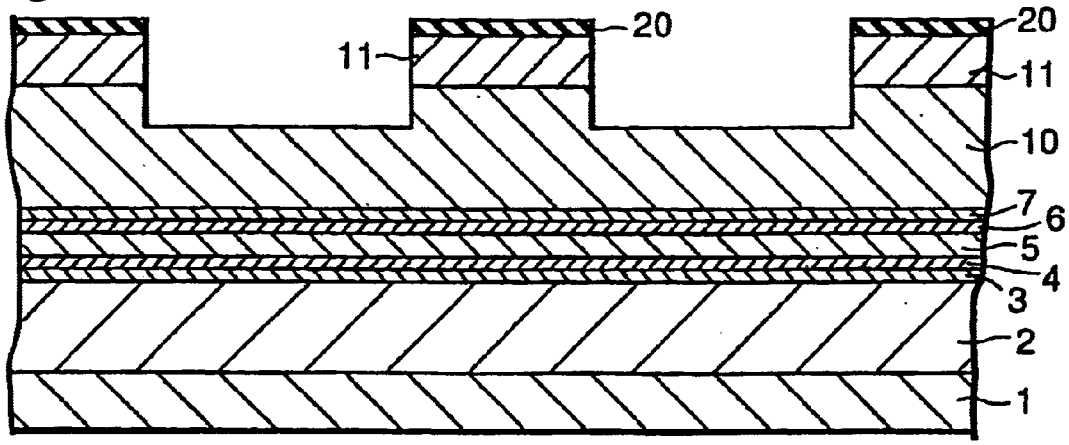

Then as shown in FIG. 8B, the $SiO_2$ insulation layer 20 is formed and is then removed by etching while leaving a region where the ridge is to be formed. Then as shown in FIG. 8C, the p-type InGaAs contact layer below the portion without the $SiO_2$ insulation layer 20 is completely etched away by dry etching using the $SiO_2$ insulation layer 20 as a mask, and the p-type InP layer 10 is etched midway.

Figure 8D:
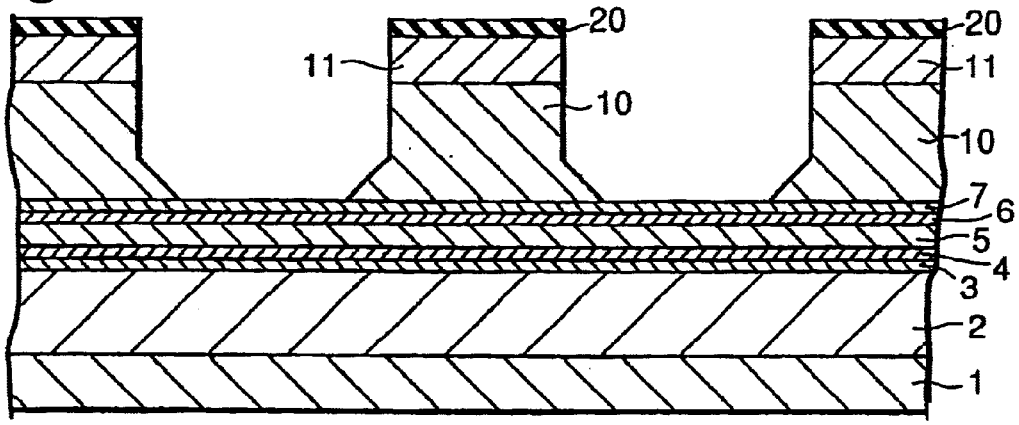

Then as shown in FIG. 8D, the p-type InP layer 10 is etched in wet etching, with the etching step being stopped at the AlInAs cladding layer 7 so that a configuration splayed toward the p-type AlInAs cladding layer is obtained. For the wet etching solution, for example, a mixture of hydrochloric acid and phosphoric acid in proportion of 1:1 may be used similarly to the second embodiment. Since the InP layer and the AlInAs layer have great difference in the etching rate by the mixture of hydrochloric acid and phosphoric acid in proportion of 1:1, the etching step can be stopped at the AlInAs cladding layer 7. The InP layer and the AlInAs layer have also great difference in the etching rate when the mixture of hydrochloric acid and phosphoric acid in proportion of 1:2 is used similarly to the first embodiment, and therefore the etching step can be stopped at the AlInAs cladding layer 7.

Figure 8E:
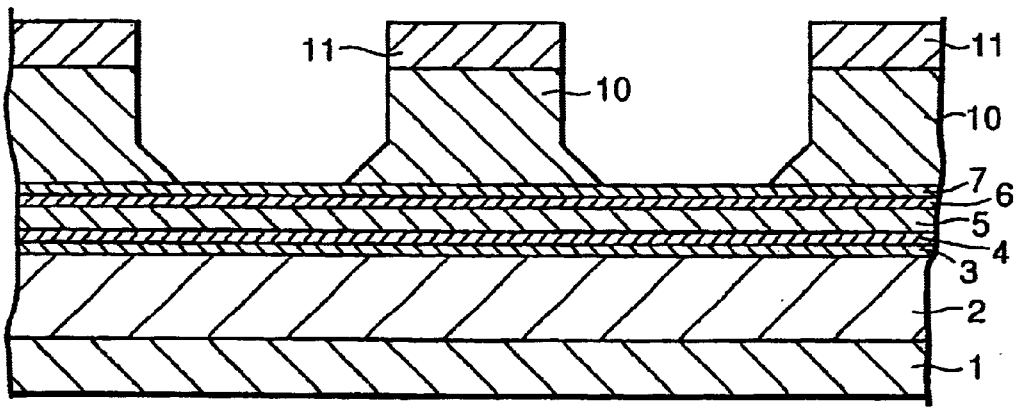
Figure 8F:
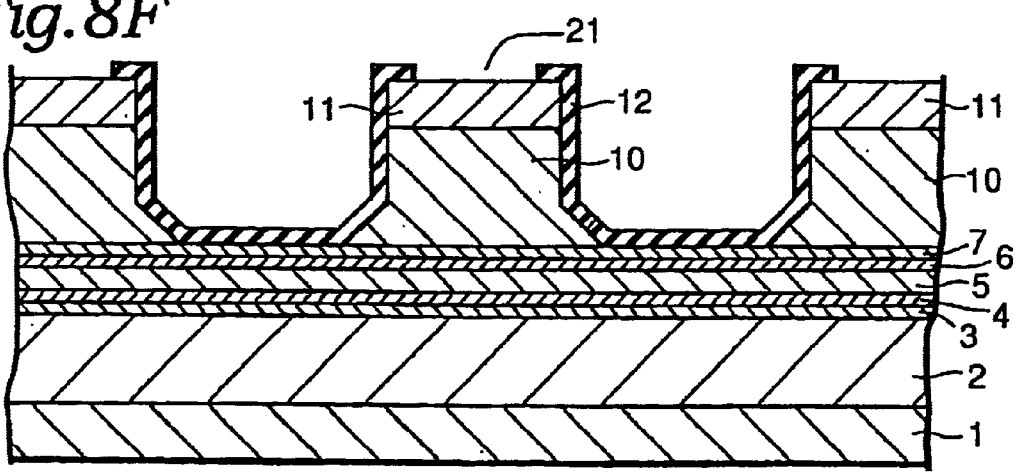

Then the $SiO_2$ insulation layer 20 is removed by etching as shown in FIG. 8E, and the $SiO_2$ insulation layer 12 is formed except the portion on top of the ridge 10 as shown in FIG. 8F. By forming the p-type electrode 13 and the n-type electrode 14 of the laser, the ridge waveguide semiconductor laser shown in FIG. 8 is completed.

Embodiment 4

Figure 9:
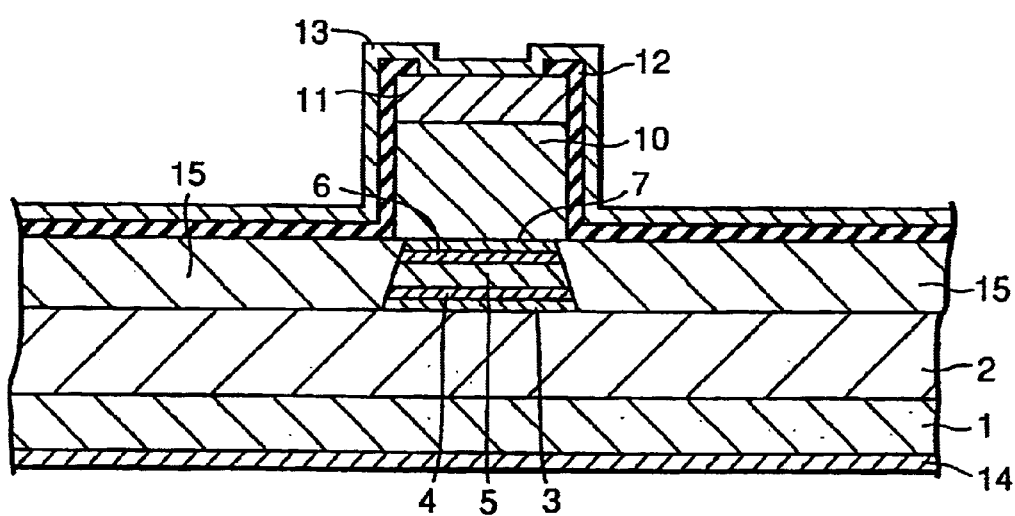
FIG. 9 is a sectional view showing a ridge waveguide semiconductor laser according to the fourth embodiment of the present invention.

FIG. 9 is a sectional view showing the ridge waveguide semiconductor laser according to the fourth embodiment of the invention. In FIG. 9, numeral 1 denotes an n-type InP substrate, 2 denotes an n-type InP cladding layer (thickness 1 μm, carrier concentration $N=1\times10^{18}$ $cm^{-3}$), 3 denotes an n-type AlInAs cladding layer (thickness 0.1 μm, carrier concentration $N=1\times10^{18}$ $cm^{-3}$), 4 denotes an n-type AlGaInAs light confinement layer (thickness 0.1 μm, carrier concentration $N=1\times10^{18}$ $cm^{-3}$), 5 denotes an AlGaInAs quantum well layer, 6 denotes a p-type AlGaInAs light confinement layer (thickness 0.1 μm, carder concentration $N=1\times10^{18}$ $cm^{-3}$), 7 denotes a p-type AlInAs cladding layer (thickness 0.1 μm, carrier concentration $N=1\times10^{18}$ $cm^{-3}$), 10 denotes a ridge portion comprising a p-type InP layer (thickness 1.5 μm, carrier concentration $N=1\times10^{18}$ $cm^{-3}$), 11 denotes a p-type InGaAs contact layer (thickness 0.1 μm, carrier concentration $N=1\times10^{19}$ $cm^{-3}$), 12 denotes an $SiO_2$ insulation layer, 13 denotes a p-type electrode (Au) of the laser, 14 denotes an n-type electrode (Au/Ge/Ni/Au), 15 denotes a high resistance layer of the Al(Ga)InAs layer (high resistance layers of the n-type AlInAs cladding layer 3, n-type AlGaInAs light confinement layer 4, AlGaInAs quantum well layer 5, p-type AlGaInAs light confinement layer 6, and the p-type AlInAs cladding layer 7).

In the ridge waveguide semiconductor laser of this embodiment, since resistance of the active layer (that is the AlGaInAs quantum well layer 5) including the PN junction is increased in the region that interposes the portion right below the ridge of the InP layer 10, parasitic capacitance formed by the PN junction in the region beside the ridge where current does not flow is decreased. Also because resistance is increased in the p-type AlInAs cladding layer 7 and the p-type AlGaInAs light confinement layer 6 that electrically connect the parasitic capacitance to the main current path, effect of the parasitic capacitance formed by the PN junction on the laser characteristic is reduced and the laser of excellent high-frequency characteristic can be obtained. In this embodiment, resistance is increased in both the n-type AlInAs cladding layer 6 and the n-type AlGaInAs light confinement layer 4 at the same time, in order to facilitate the production process to be described later.

Figure 10A:
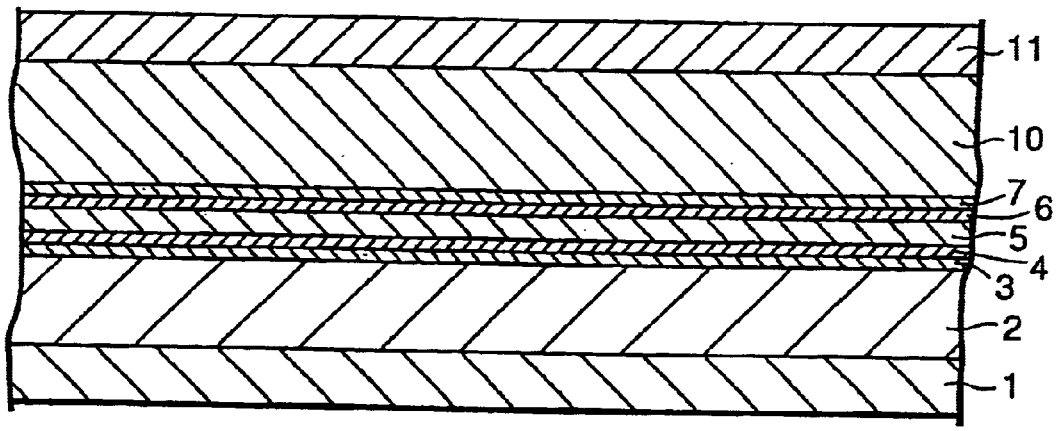
FIGS. 10A through 10H show a process of producing the ridge waveguide semiconductor laser according to the fourth embodiment of the present invention.

FIGS. 10A through 10F show a process of producing the ridge waveguide semiconductor laser of this embodiment. First, as shown in FIG. 10A, the n-type InP cladding layer 2, the n-type AlInAs cladding layer 3, the n-type AlGaInAs light confinement layer 4, the AlGaInAs quantum well layer 5, the p-type AlGaInAs light confinement layer 6, the p-type AlInAs cladding layer 7, the p-type InP layer 10 and the p-type InGaAs contact layer 11 are grown one on another on the n-type InP substrate 1 by, for example, the MOCVD process.

Figure 10B:
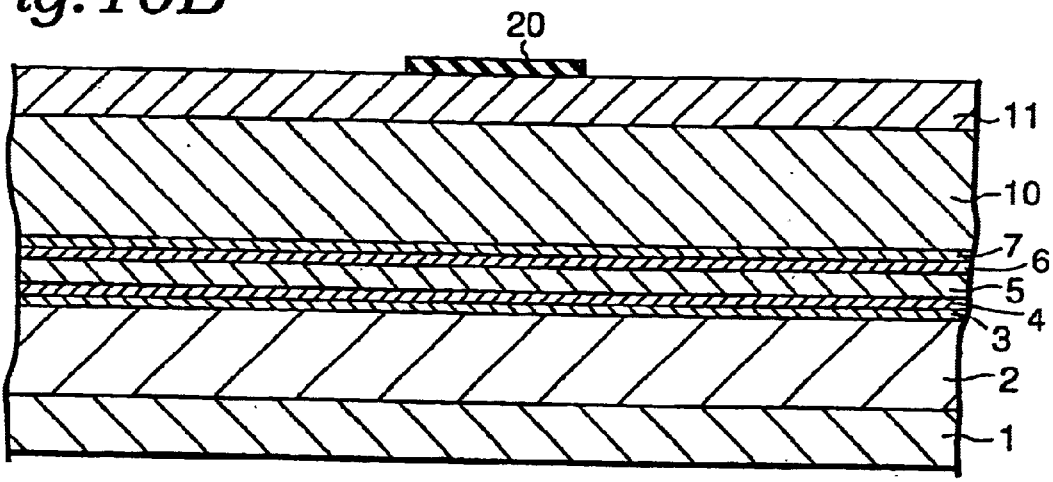
Figure 10C:
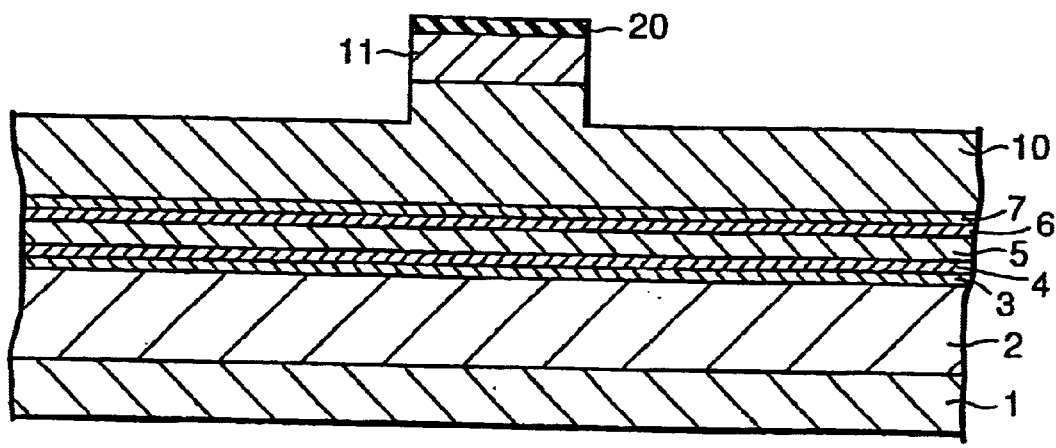

Then as shown in FIG. 10B, the $SiO_2$ insulation layer 20 is formed and is then removed by etching in the photolithography process while leaving a region where the ridge is to be formed. Then as shown in FIG. 10C, the p-type InGaAs contact layer below the portion without the $SiO_2$ insulation layer 20 is completely etched away by dry etching using the $SiO_2$ insulation layer 20 as a mask, and the p-type InP layer 10 is etched midway.

Figure 10D:
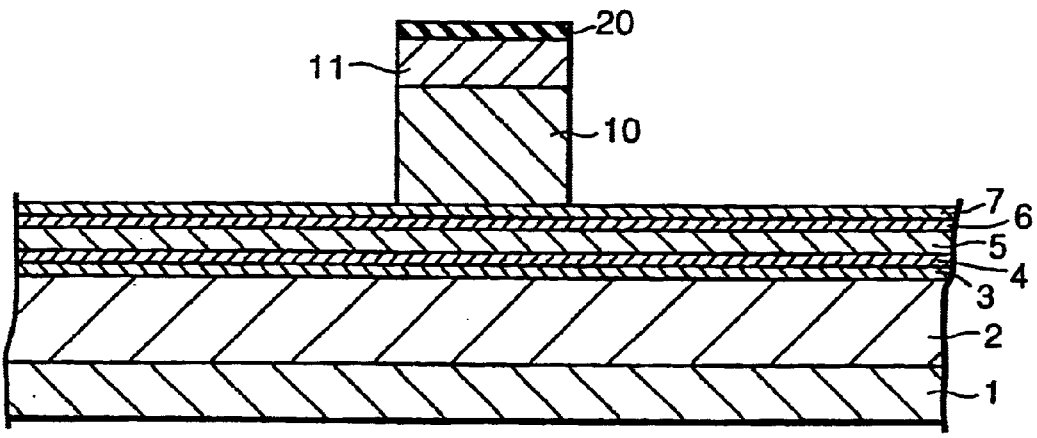

Then as shown in FIG. 10D, the p-type InP layer 10 is completely etched in wet etching, with the etching step being stopped at the p-type AlInAs cladding layer 7. For the wet etching solution, a mixture of hydrochloric acid and phosphoric acid (mix proportion of 1:2) may be used that makes it possible to stop the etching step at the p-type AlInAs cladding layer 7 because of great difference in the selective etching rate between the InP layer and the Al(Ga)InAs layer. Using the mixture of hydrochloric acid and phosphoric acid with long etching duration, the etching proceeds only downward and hardly proceeds in the lateral direction. As a result, a vertical ridge can be formed.

Figure 10E:
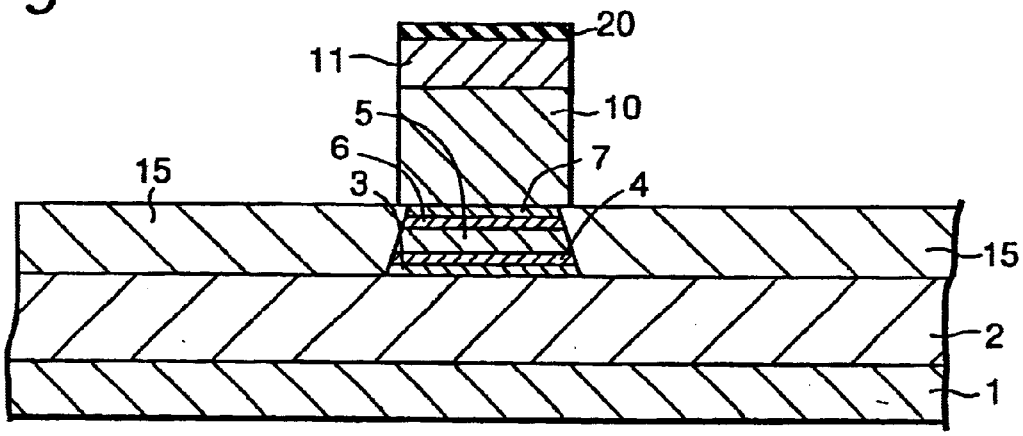

Then as shown in FIG. 10E, resistance is increased in the n-type AlInAs cladding layer 3, the n-type AlGaInAs light confinement layer 4, the AlGaInAs quantum well layer 5, the p-type AlGaInAs light confinement layer 6 and the p-type AlInAs cladding layer 7, except for the region right below the ridge 10.

Resistance may be increased by either of the following two methods. The first method is to anneal the active layer by injecting helium, proton or oxygen ions therein. Resistance of a semiconductor layer that includes Al can be increased with this method. The second method is to oxidize the layer that includes Al. Specifically, as described in Jpn. J. Appl. Phys., Part136, 1896 (1997), a wafer is put into a furnace of which temperature is controlled within a range from 450 to 500° C., and nitrogen that has passed bubbling through water of which temperature is controlled at 85° C. is circulated through the furnace, and the wafer is annealed. Resistance of a layer that includes Al can be increased by oxidizing, also with this method.

Such processes to increase resistance as described above can be carried out by using the InP layer 10 of ridge shape as the mask, which makes it possible to increase the resistance without an additional process of forming the mask. For the improvement of high-frequency characteristic of the laser, it is sufficient to increase the resistance of the layer wherein parasitic capacitance is formed by the PN junction and of the layers where the parasitic capacitance and the current path are connected. In this embodiment, the layer wherein parasitic capacitance is formed by the PN junction is the AlGaInAs quantum well layer 5. The layers where the parasitic capacitance and the current path are connected are the p-type AlGaInAs light confinement layer 6 and the p-type AlInAs cladding layer 7. Therefore, the n-type AlGaInAs light confinement layer 4 and the n-type AlInAs cladding layer 3 may be excluded from the process of increasing the resistance. The process of increasing the resistance can be simplified, however, by increasing the resistance of the n-type AlGaInAs light confinement layer and the n-type AlInAs cladding layer 3 at the same time, since the resistance increasing process acts selectively on layers that include Al.

Figure 10F:
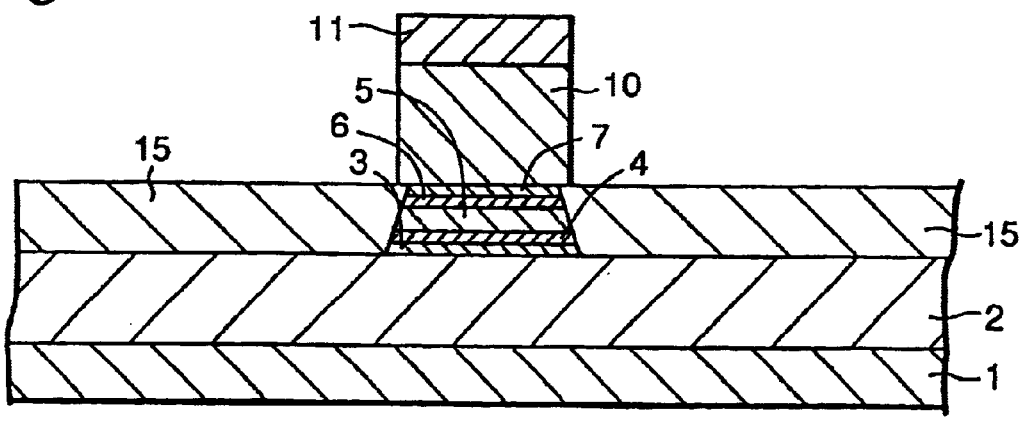
Figure 10G:
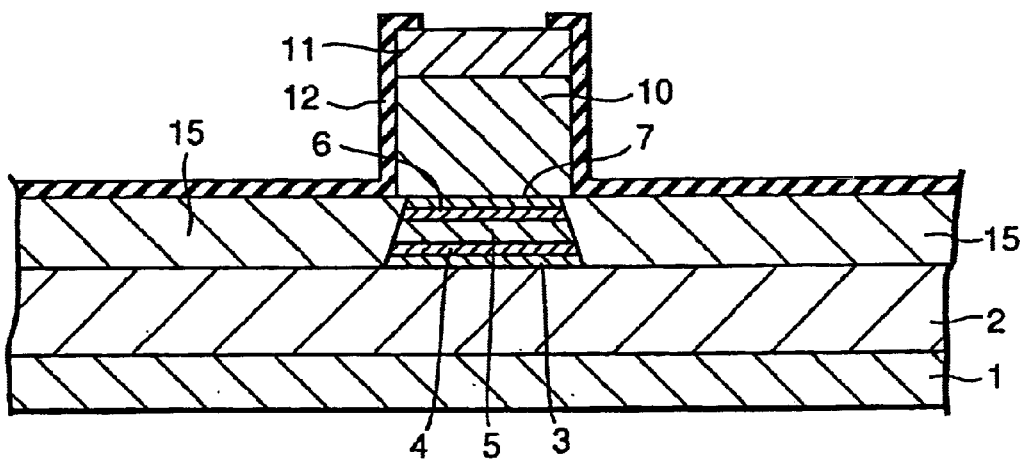
Figure 10H:
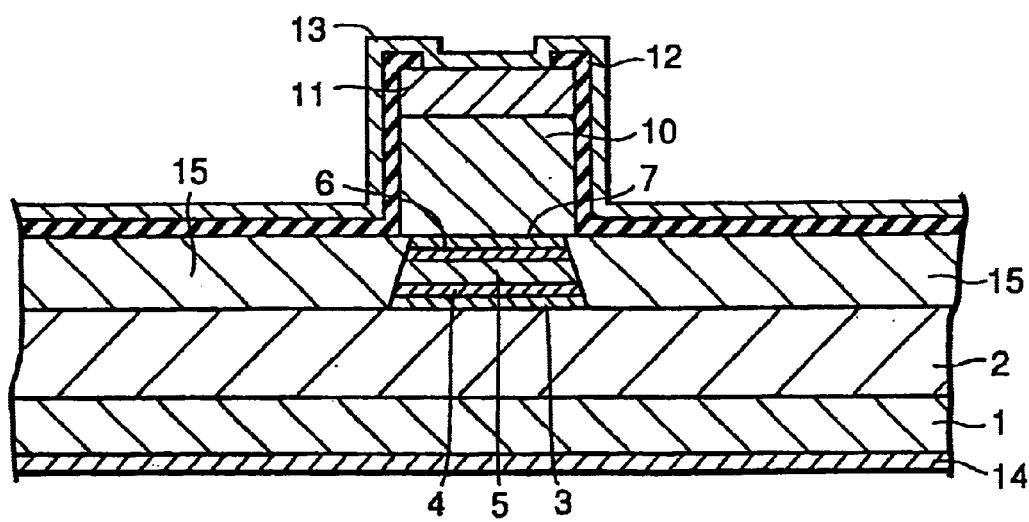

Then the $SiO_2$ insulation layer 20 is removed by etching as shown in FIG. 10F and, after the $SiO_2$ insulation layer 12 is formed, only the portion on top of the ridge 10 is removed by etching in the photolithography process as shown in FIG. 10G By forming the p-type electrode 13 and the n-type electrode 14, the semiconductor laser of this embodiment is completed as shown in FIG. 10H.

Embodiment 5

Figure 11:
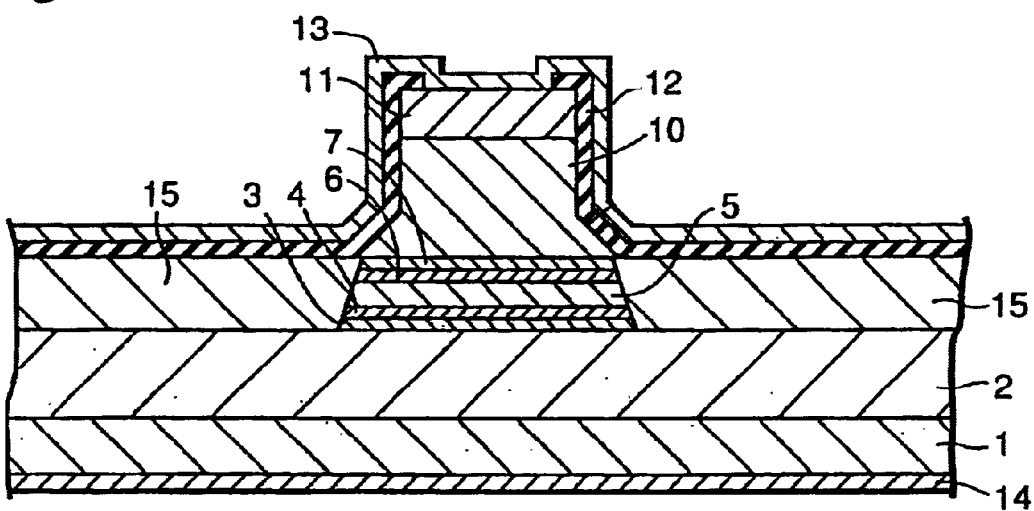
FIG. 11 is a sectional view showing a ridge waveguide semiconductor laser according to the fifth embodiment of the present invention.

FIG. 11 is a sectional view showing the ridge waveguide laser according to the fifth embodiment. The ridge waveguide laser of this embodiment has a configuration similar to that of the fourth embodiment, except that the ridge 10 is formed in a shape splayed downward like a skirt, similarly to the second and the third embodiments.

In the fourth embodiment, since the resistance of the active layer is increased in the region interposing the portion right below the vertical InP ridge 10, the light emitting region overlaps significantly with the layers of which resistance is increased. This gives rise to the problem of light absorption loss due to the high resistance layer, because of the high light absorption coefficient of the semiconductor layer of which resistance is increased. In this embodiment, therefore, the ridge 10 is formed in a shape splayed downward like a skirt so that the light emitting region overlaps less with the high resistance layers 15, thereby reducing the light absorption loss due to the high resistance layer 15. The light absorption loss due to the metal electrode 13 may also be reduced similarly to the second and the third embodiments.

Figure 12A:
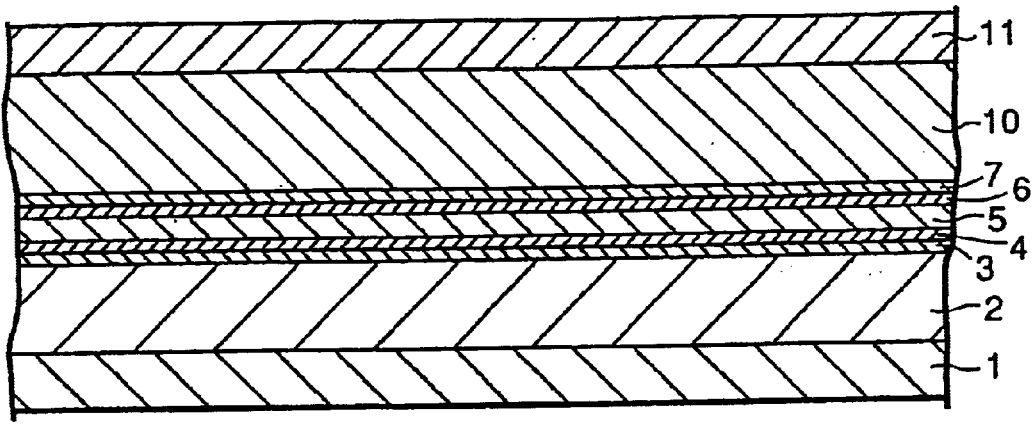
FIGS. 12A through 12H show a process of producing the ridge waveguide semiconductor laser according to the fifth embodiment of the present invention.

FIGS. 12A through 12H show a process of producing the ridge waveguide semiconductor laser of this embodiment. First, as shown in FIG. 12A, the n-type InP cladding layer 2, the n-type AlInAs cladding layer 3, the n-type AlGaInAs light confinement layer 4, the AlGaInAs quantum well layer 5, the p-type AlGaInAs light confinement layer 6, the p-type AlInAs cladding layer 7, the p-type InP layer 10 and the p-type InGaAs contact layer 11 are grown one on another on the n-type InP substrate 1 by, for example, the MOCVD process.

Figure 12B:
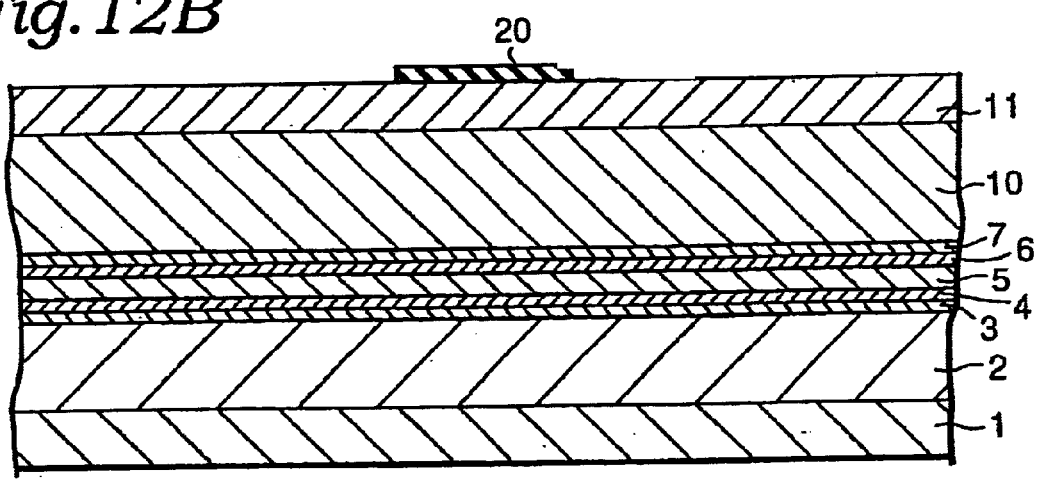
Figure 12C:
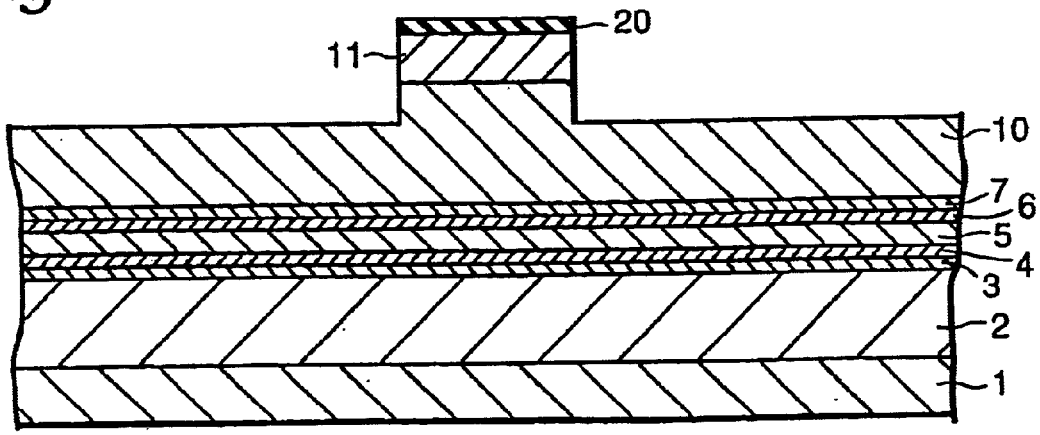

Then as shown in FIG. 12B, the $SiO_2$ insulation layer 20 is formed and is then removed by etching in the photolithography process while leaving a region where the ridge is to be formed. Then as shown in FIG. 12C, the p-type InGaAs contact layer below the portion without the $SiO_2$ insulation layer 20 is completely etched away by dry etching using the $SiO_2$ insulation layer 20 as a mask, and the p-type InP layer 10 is etched midway.

Figure 12D:
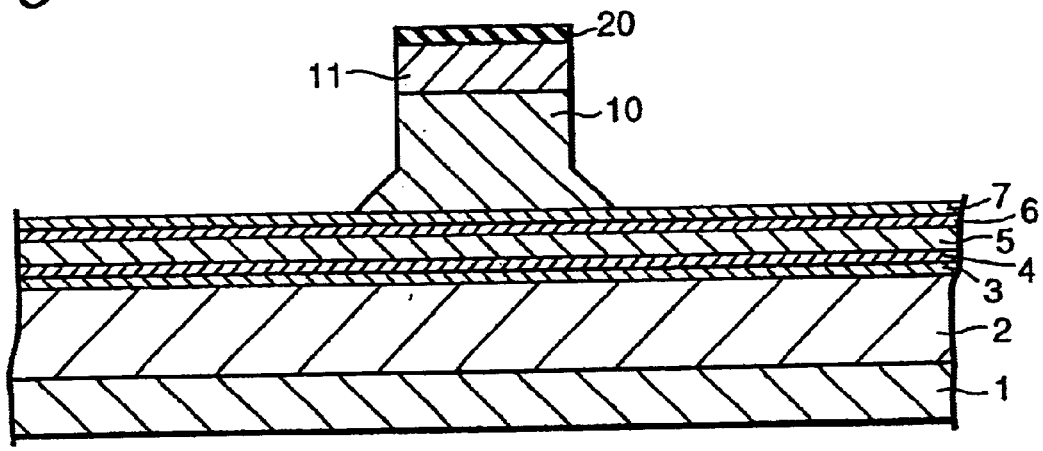
Figure 12E:
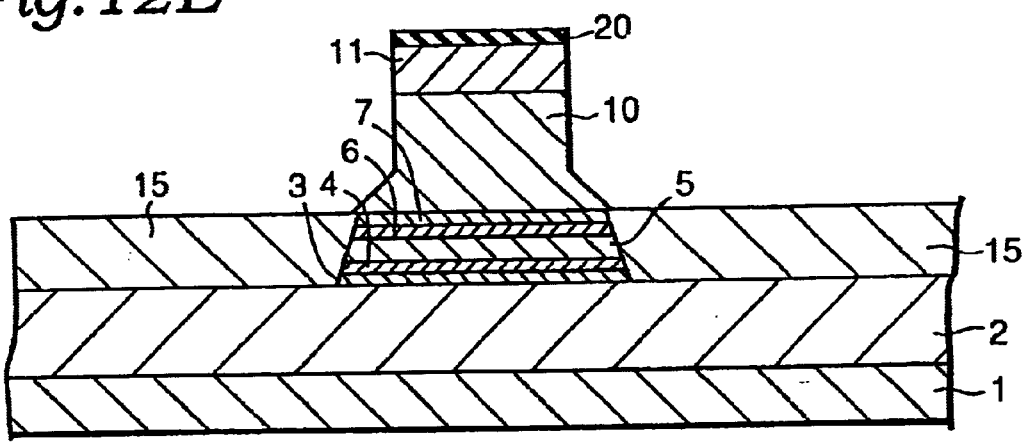

Then as shown in FIG. 12D, the p-type InP layer 10 is completely etched in wet etching, with the etching step being stopped at the p-type AlInAs cladding layer 7. For the wet etching solution, a mixture of hydrochloric acid and phosphoric acid (mix proportion of 1:1) may be used that makes it possible to stop the etching step at the p-type AlInAs cladding layer 7 because of the great difference in the selective etching rate between the InP layer and the Al(Ga)InAs layer. Sloping etched side faces can also be formed similarly to the second and the third embodiments, by using the mixture of hydrochloric acid and phosphoric acid in a proportion of 1:1 and properly controlling the duration of etching. Then as shown in FIG. 12E, resistance is increased in the n-type AlInAs cladding layer 3, the n-type AlGaInAs light confinement layer 4, the AlGaInAs quantum well layer 5, the p-type AlGaInAs light confinement layer 6 and the p-type AlInAs cladding layer 7, except for the region right below the ridge, by using the InP cladding layer 10 as a mask. A method similar to those described in conjunction with the fourth embodiment may be used for increasing the resistance.

Figure 12F:
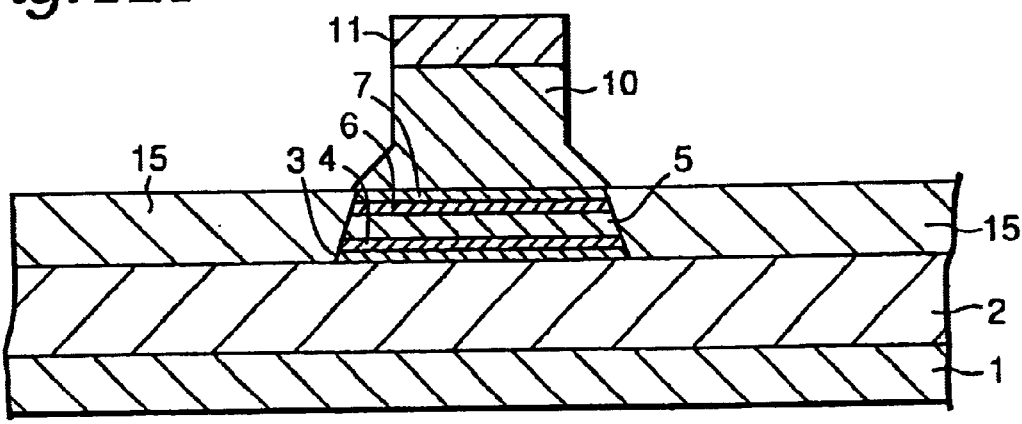
Figure 12G:
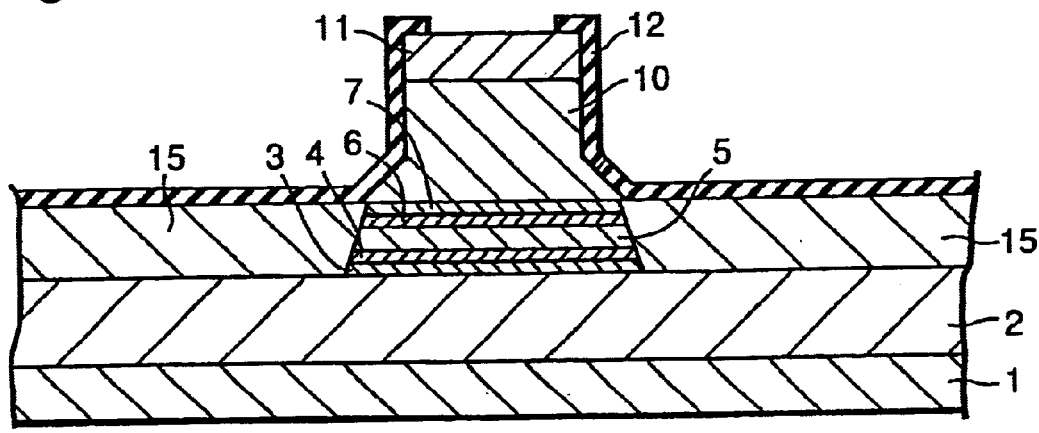
Figure 12H:
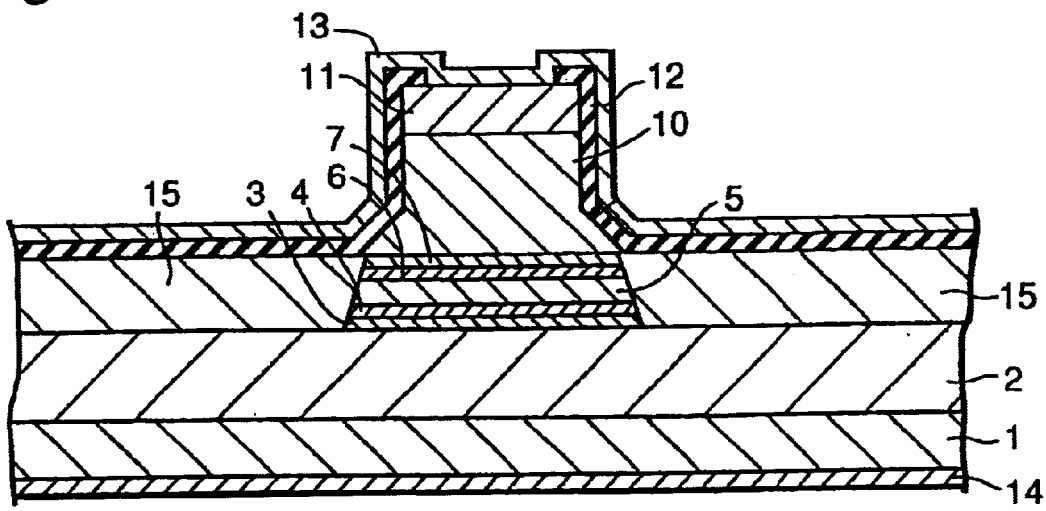

Then the $SiO_2$ insulation layer 20 is removed by etching as shown in FIG. 12F, and the $SiO_2$ insulation layer 12 is formed with only the portion on top of the ridge 10 being removed by etching in the photolithography process as shown in FIG. 12G By forming the p-type electrode 13 and the n-type electrode 14 of the laser, the ridge waveguide semiconductor laser of this embodiment is completed as shown in FIG. 12H.

Embodiment 6

Figure 13:
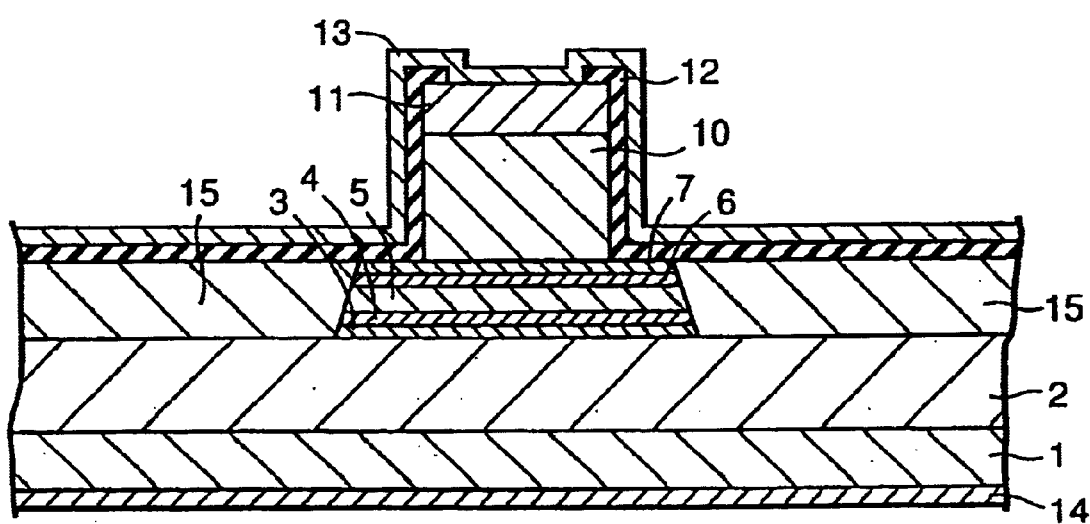
FIG. 13 is a sectional view showing a ridge waveguide semiconductor laser according to the sixth embodiment of the present invention.

FIG. 13 is a sectional view showing the ridge waveguide semiconductor laser according to the sixth embodiment of the present invention. The semiconductor laser of this embodiment has a configuration similar to that of the fourth embodiment, except that the high resistance region 15 is located at a position a little away from the ridge.

Figure 14A:
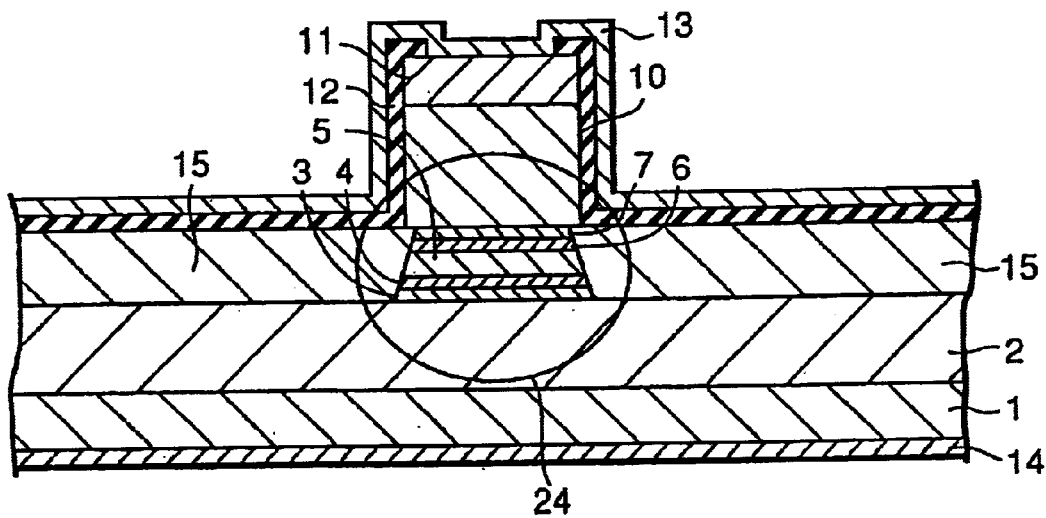
FIG. 14A shows the distribution of light in the ridge waveguide semiconductor laser of the fourth embodiment.
Figure 14B:
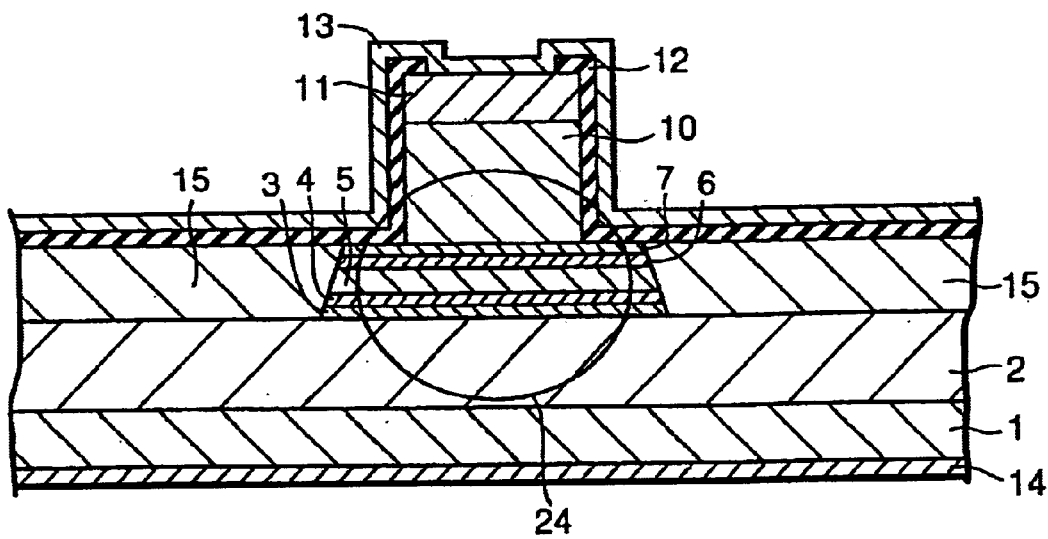
FIG. 14B shows the distribution of light in the ridge waveguide semiconductor laser of the sixth embodiment of the present invention.

As described in conjunction with the fifth embodiment, the light emitting region 24 overlaps with the high resistance region 15 in the semiconductor laser of the fourth embodiment as shown in FIG. 14A. This gives rise to the problem of light absorption loss due to the high resistance region 15. In this embodiment, therefore, overlap of the light emitting region 24 with the high resistance region 15 is reduced by increasing the resistance of the active layer while leaving a wider region including the portion right below the ridge 10. Aims of this embodiment are substantially the same as those of the fifth embodiment. However, while the light emitting region 24 is not completely separated from the high resistance region 15 due to the tendency of current to spread in the splayed portion at the base of the ridge in the fifth embodiment, the light emitting region 24 can be completely separated from the high resistance layer 15 in this embodiment.

Figure 15A:
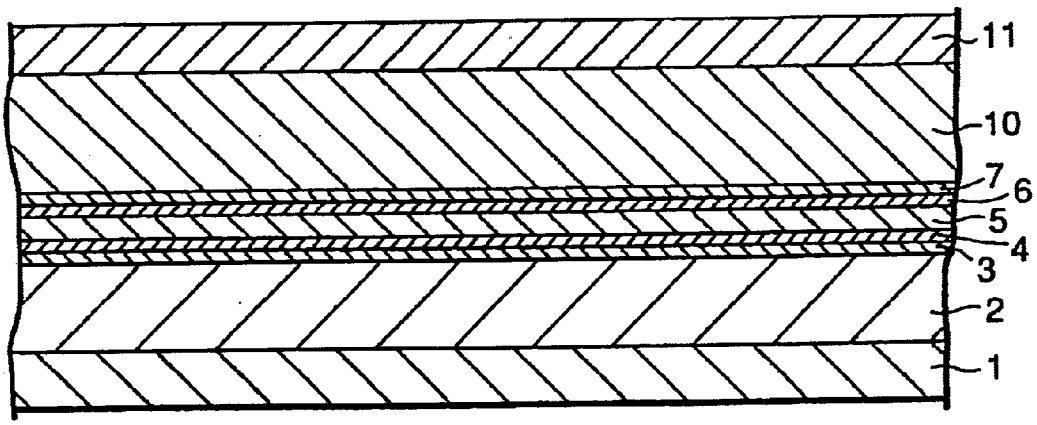
FIGS. 15A through 15I show one half of the process of producing the ridge waveguide semiconductor laser according to the sixth embodiment of the present invention.

FIGS. 15A through 15I show a process of producing the ridge waveguide semiconductor laser of this embodiment. First, as shown in FIG. 15A, the n-type InP cladding layer 2, the n-type AlInAs cladding layer 3, the n-type AlGaInAs light confinement layer 4, the AlGaInAs quantum well layer 5, the p-type AlGaInAs light confinement layer 6, the p-type AlInAs cladding layer 7, the p-type InP layer 10 and the p-type InGaAs contact layer 11 are grown one on another on the n-type InP substrate 1 by, for example, the MOCVD process.

Figure 15B:
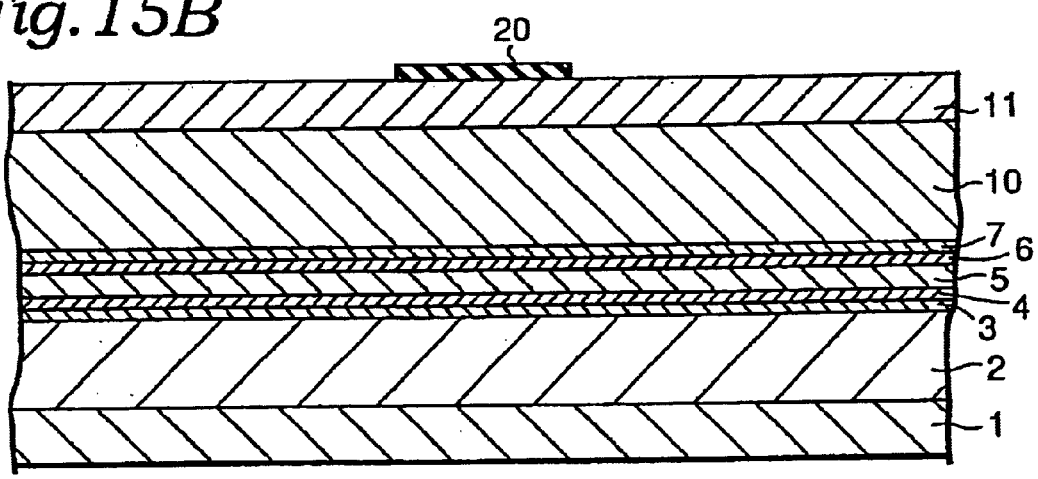
Figure 15C:
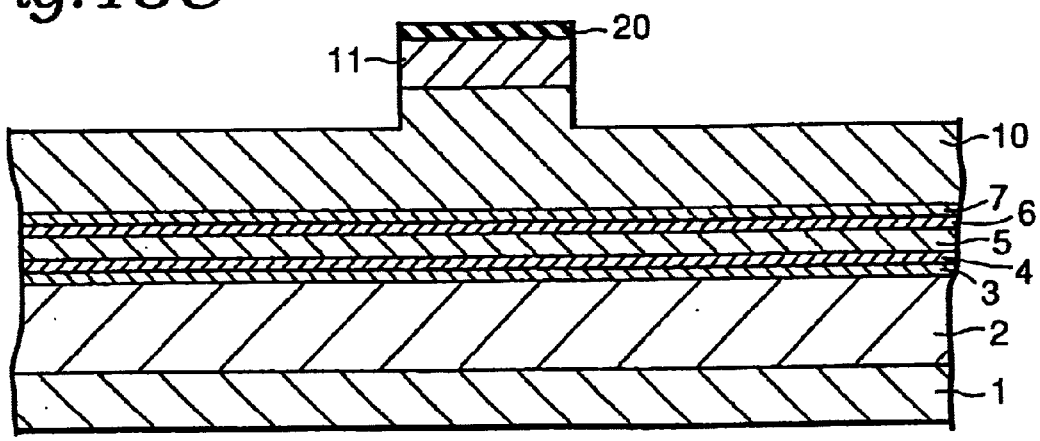
Figure 15D:
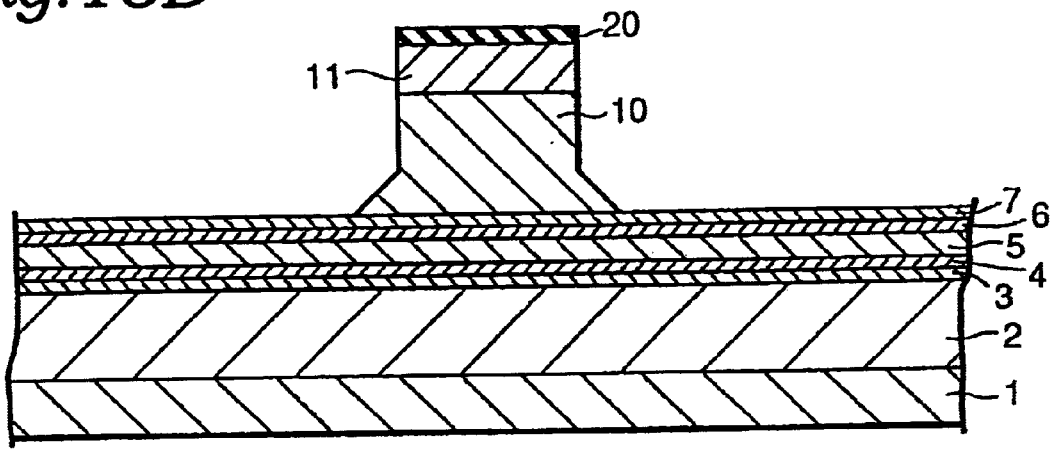

Then as shown in FIG. 15B, the $SiO_2$ insulation layer 20 is formed and is then removed by etching while leaving a region where the ridge 10 is to be formed. Then as shown in FIG. 15C, the p-type InGaAs contact layer below the portion without the SiO$_2$ insulation layer 20 is completely etched away by using the SiO$_2$ insulation layer 20 as a mask, and the p-type InP layer 10 is etched midway. Then as shown in FIG. 15D, the p-type InP layer 10 is etched in wet etching, with the etching step being stopped at the p-type AlInAs cladding layer 7 so that the p-type InP layer 10 is formed in a shape being splayed. For the wet etching solution, for example, a mixture of hydrochloric acid and phosphoric acid (mix proportion of 1:1) is used, while properly controlling the duration of etching so that the splayed shape is obtained. At this time, (1,1,1) B plane appears on the sloped side face. Even when the mixture of hydrochloric acid and phosphoric acid (mix proportion of 1:1) is used, the great difference in the selective etching rate between the InP layer and the AlInAs layer makes it possible to stop the etching step at the p-type AlInAs cladding layer 7.

Figure 15E:
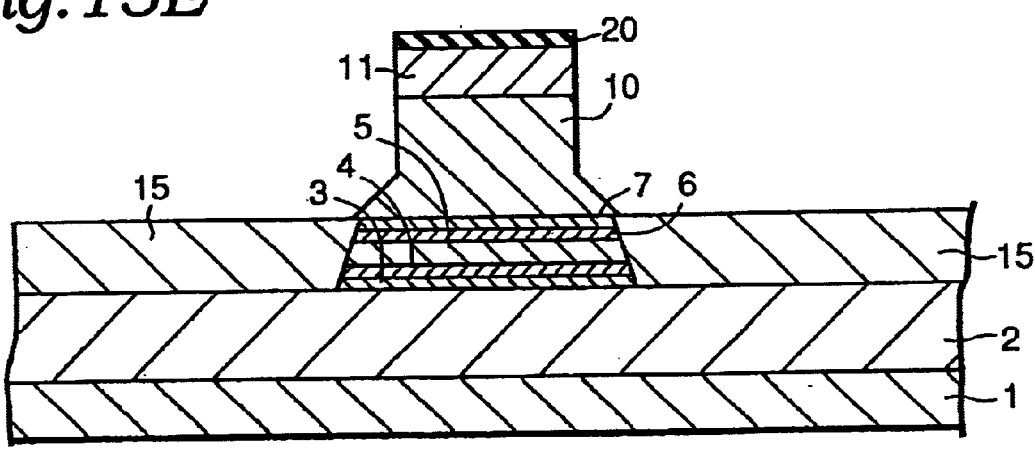

Then as shown in FIG. 15E, resistance is increased in the n-type AlInAs cladding layer 3, the n-type AlGaInAs light confinement layer 4, the AlGaInAs quantum well layer 5, the p-type AlGaInAs light confinement layer 6 and the p-type AlInAs cladding layer 7, except for the region below the ridge. A method similar to those of the fourth and the fifth embodiments may be used for increasing the resistance.

Figure 15F:
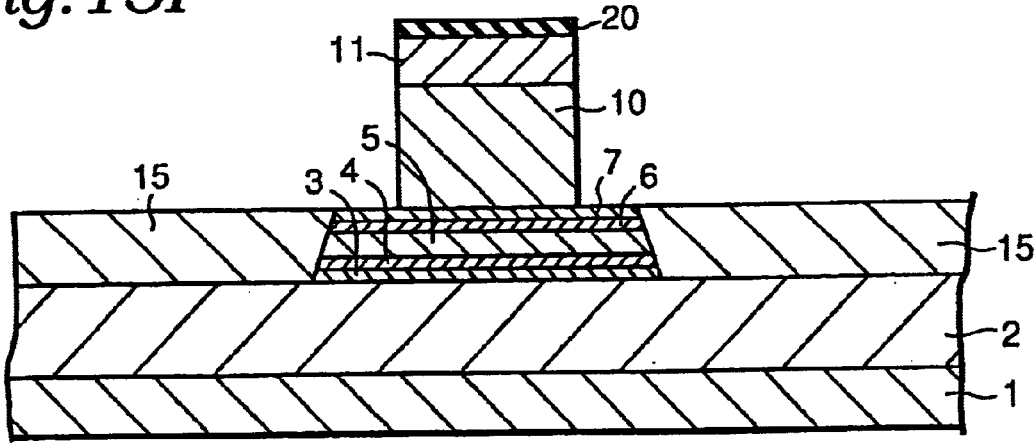

Then as shown in FIG. 15F, the p-type InP layer 10 is etched only in the splayed portion thereof by wet etching, to form a vertical ridge configuration. When a mixture of hydrochloric acid and phosphoric acid (mix proportion in volume of 1:2) is used for the wet etching solution, for example, (1,1,1) B plane of the sloped side face of the InP ridge is etched while (1,1̄,0) plane of the vertical side face of the ridge is hardly etched, so that only the splayed portion of the ridge is etched away. Thus the ridge having vertical configuration is formed. With the mixture of hydrochloric acid and phosphoric acid (mix proportion in volume of 1:2), too, the p-type AlInAs cladding layer 7 is hardly etched because of the great difference in the selective etching rate between the InP layer 10 and the AlInAs layer 7. Thus the Al(Ga)InAs high resistance layer 15 can be formed in a region located a little away from the region of the InP cladding layer right below the ridge.

Figure 15G:
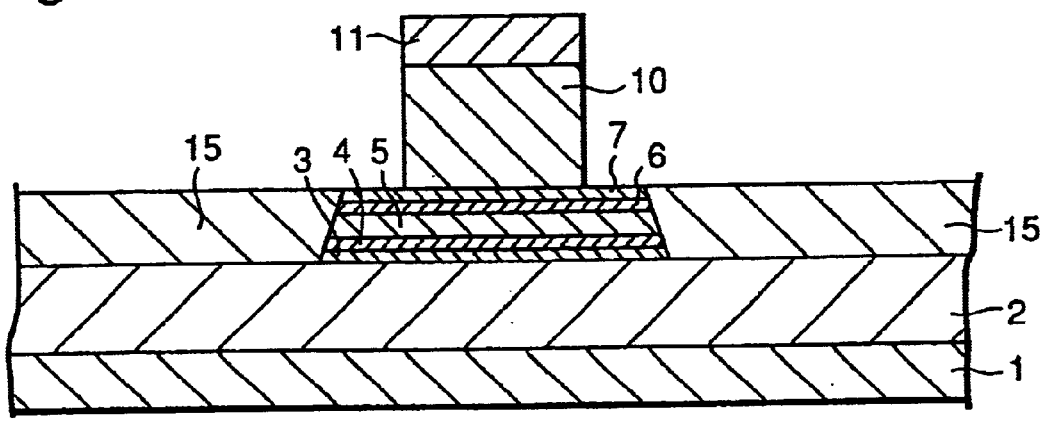
Figure 15H:
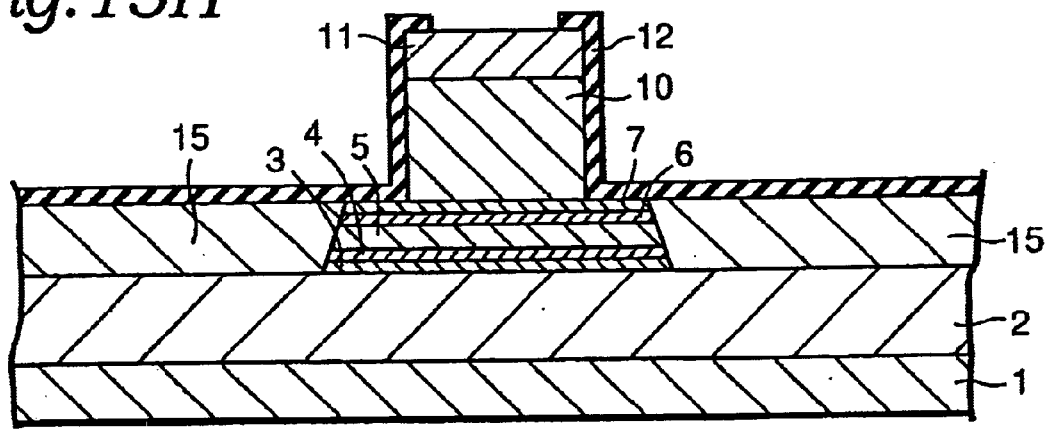
Figure 15I:
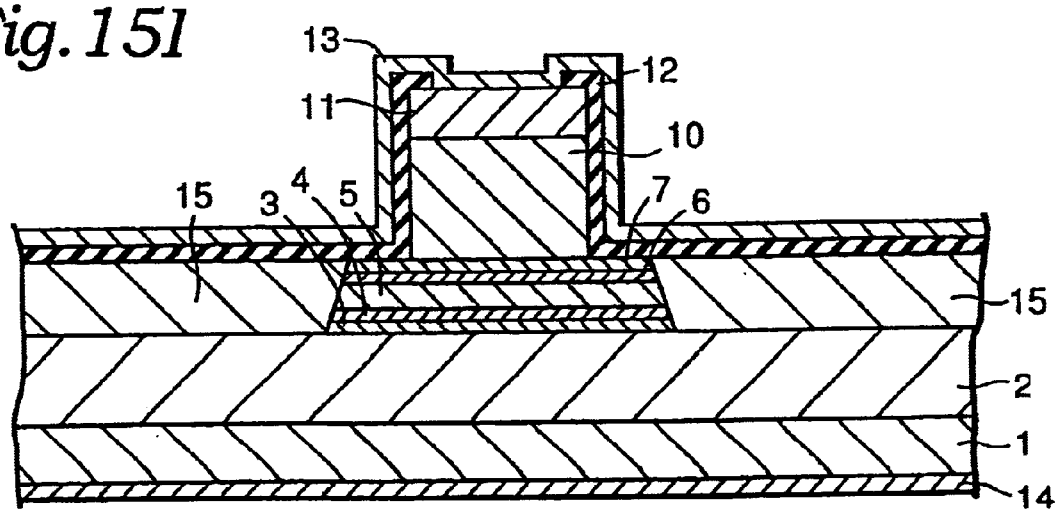

Then the SiO$_2$ insulation layer 20 is removed by etching as shown in FIG. 15G, and the SiO$_2$ insulation layer 12 is formed except the portion on top of the ridge 10 as shown in FIG. 15H. Then the p-type electrode 13 and the n-type electrode 14 of the laser are formed as shown in FIG. 15I.

Embodiment 7

Figure 16:
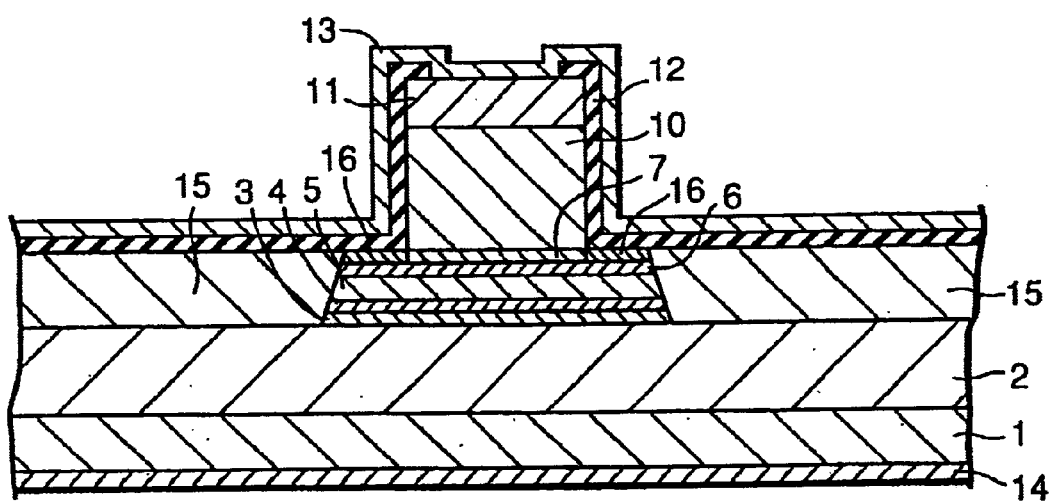
FIG. 16 is a sectional view showing a ridge waveguide semiconductor laser according to the seventh embodiment of the present invention.

FIG. 16 is a sectional view showing the ridge waveguide semiconductor laser according to the seventh embodiment of the invention. The ridge waveguide semiconductor laser of this embodiment has a configuration similar to that of the sixth embodiment, except that resistance of the p-type AlInAs cladding layer 16 is increased in the region thereof that interposes the portion right below the ridge 10.

In the sixth embodiment, a certain amount of current flows in the p-type AlInAs cladding layer 7 beside the ridge. In this embodiment, the current flowing beside the ridge is suppressed by increasing the resistance of the p-type AlInAs cladding layer 16 in the region thereof adjoining the base of the ridge on both sides. This makes it possible to decrease the threshold current of the laser. The high resistance layer of the p-type AlInAs cladding layer 16 is thin, and virtually no absorption loss of light occurs therein.

Since the resistance is increased in the active layers 3, 5 and the p-type AlInAs cladding layer 7 in the region where current does not flow similarly to the sixth embodiment, high-frequency characteristic of the laser can be improved by suppressing the effect of parasitic capacitance due to the PN junction of the active layer 5.

Figure 17A:
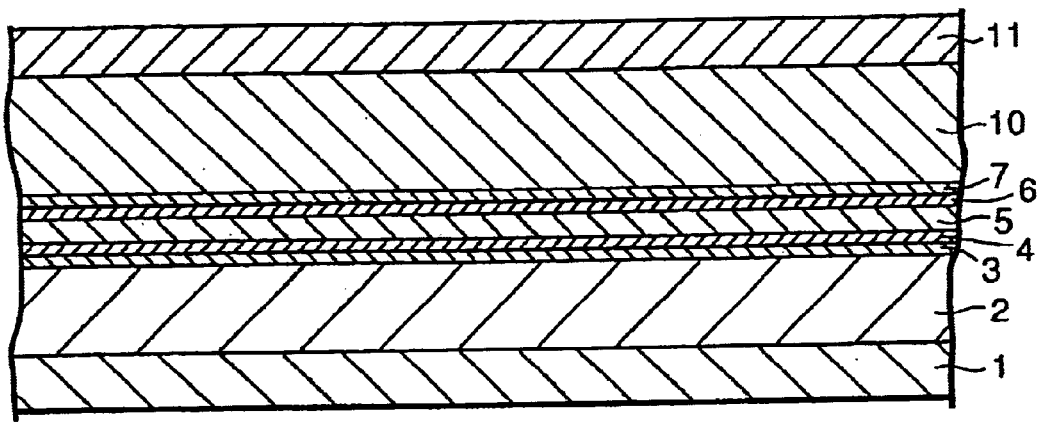
FIGS. 17A through 17I show a process of producing the ridge waveguide semiconductor laser according to the seventh embodiment of the present invention.

FIGS. 17A through 17I show a process of producing the ridge waveguide semiconductor laser of this embodiment. First, as shown in FIG. 17A, the n-type InP cladding layer 2, the n-type AlInAs cladding layer 3, the n-type AlGaInAs light confinement layer 4, the AlGaInAs quantum well layer 5, the p-type AlGaInAs light confinement layer 6, the p-type AlInAs cladding layer 7, the p-type InP layer 10 and the p-type InGaAs contact layer 11 are grown one on another on the n-type InP substrate 1 by, for example, the MOCVD process.

Figure 17B:
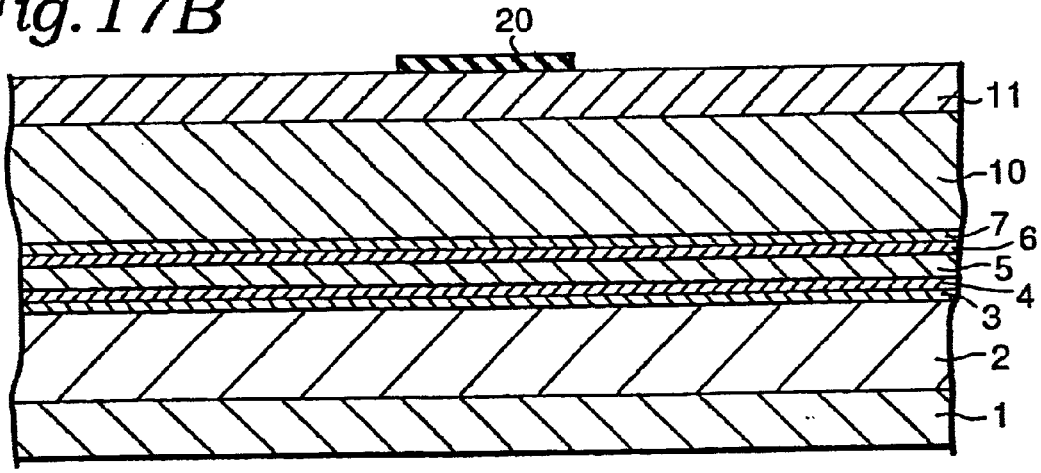
Figure 17C:
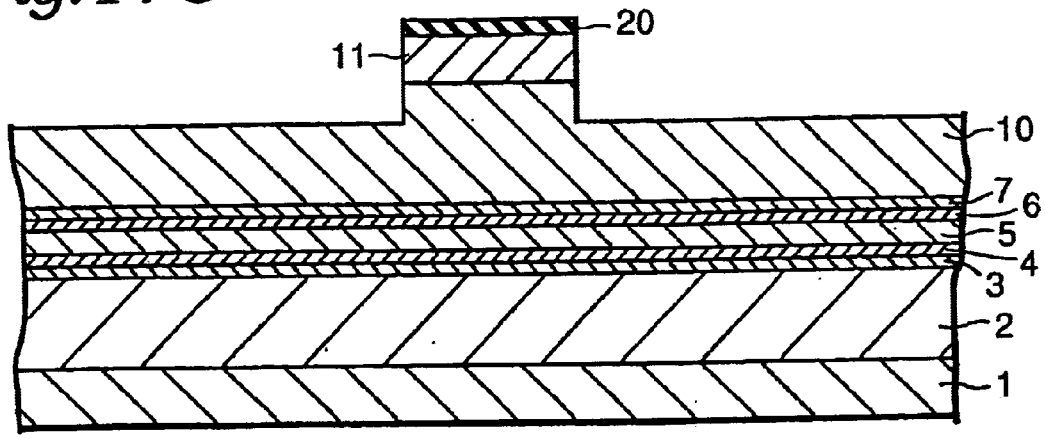

Then as shown in FIG. 17B, the SiO$_2$ insulation layer 20 is formed and is then removed by etching in the photolithography process while leaving a region where the ridge 10 is to be formed. Then as shown in FIG. 17C, the p-type InGaAs contact layer 11 below the portion without the SiO$_2$ insulation layer 20 is completely etched away by dry etching using the SiO$_2$ insulation layer 20 as a mask, and the p-type InP layer 10 is etched midway.

Figure 17D:
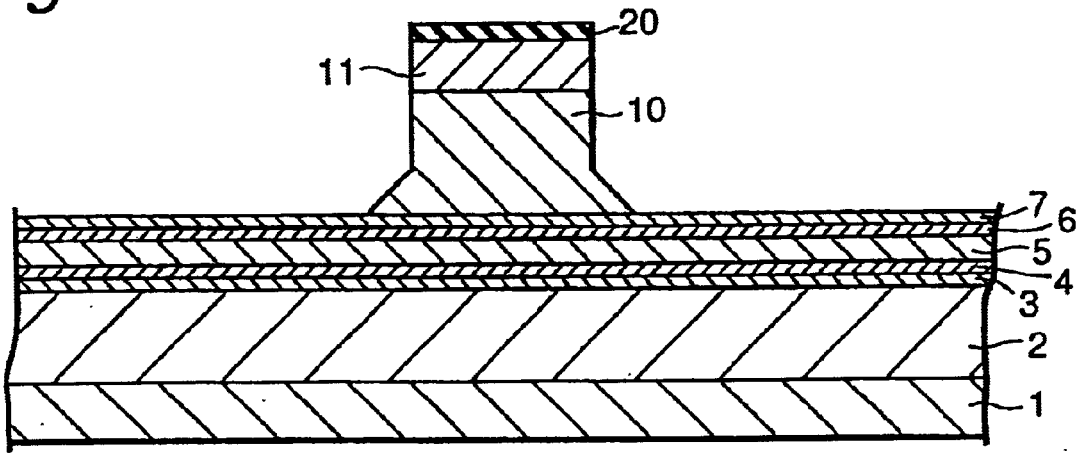
Figure 17E:
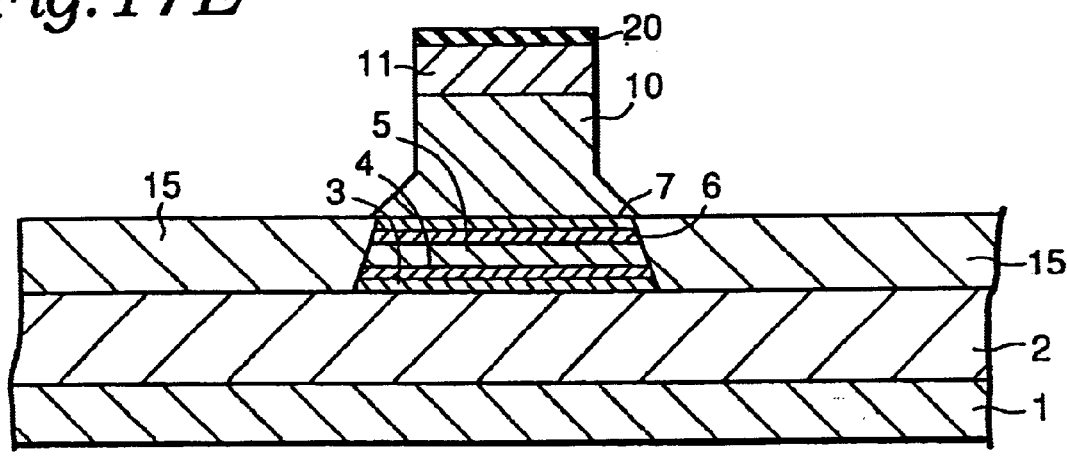

Then as shown in FIG. 17D, the p-type InP layer 10 is etched by wet etching, with the etching step being stopped at the p-type AlInAs cladding layer 7 so that the p-type InP layer 10 is formed in a splayed configuration. For the wet etching solution, for example, a mixture of hydrochloric acid and phosphoric acid (mix proportion in volume of 1:1) is used, that makes it possible to form the splayed configuration. Then as shown in FIG. 17E, resistance is increased in the n-type AlInAs cladding layer 3, the n-type AlGaInAs light confinement layer 4, the AlGaInAs quantum well layer 5, the p-type AlGaInAs light confinement layer 6 and the p-type AlInAs cladding layer 7, except for the region below the ridge. A method similar to those of the fourth through the sixth embodiments may be used for increasing the resistance.

Figure 17F:
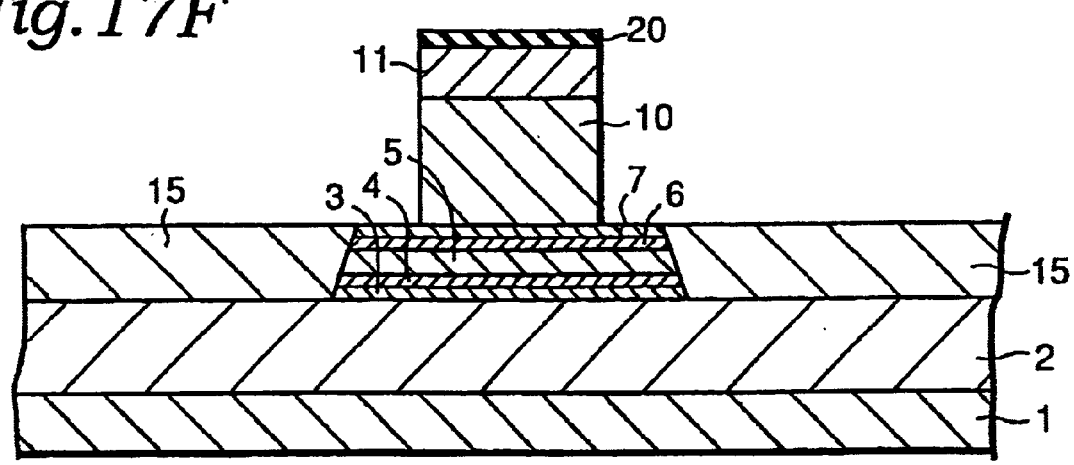

Then as shown in FIG. 17F, the p-type InP layer 10 is etched only in the splayed portion thereof by wet etching, thereby to form a vertical ridge configuration. When a mixture of hydrochloric acid and phosphoric acid is used for the wet etching solution (mix proportion of 1:2), for example, only the splayed portion is etched thereby to form the vertical ridge. The p-type AlInAs cladding layer 7 is hardly etched because of the great difference in the selective etching rate between the InP layer and the AlInAs layer. The etching of only the splayed portion makes it possible to form the high resistance layer 15 of Al(Ga)InAs in a region located a little away from the region right below the ridge.

Figure 17G:
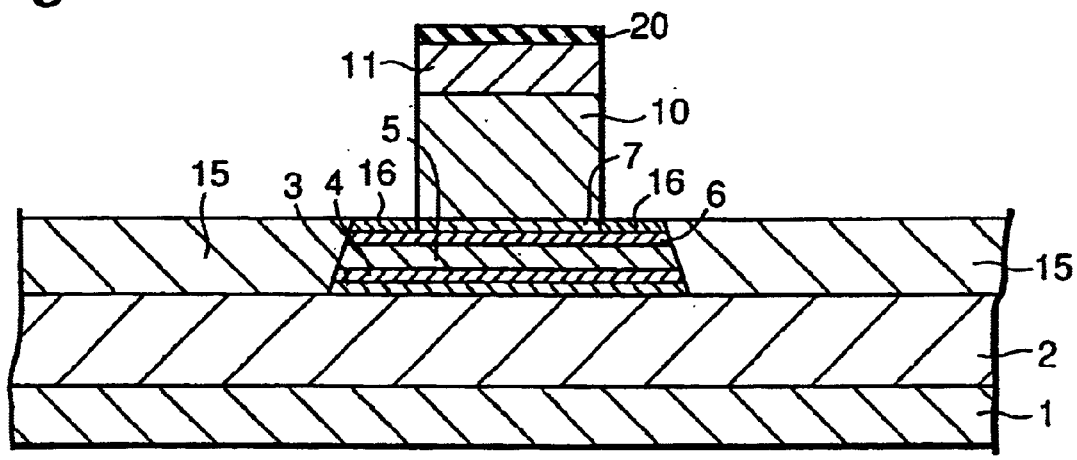
Figure 17H:
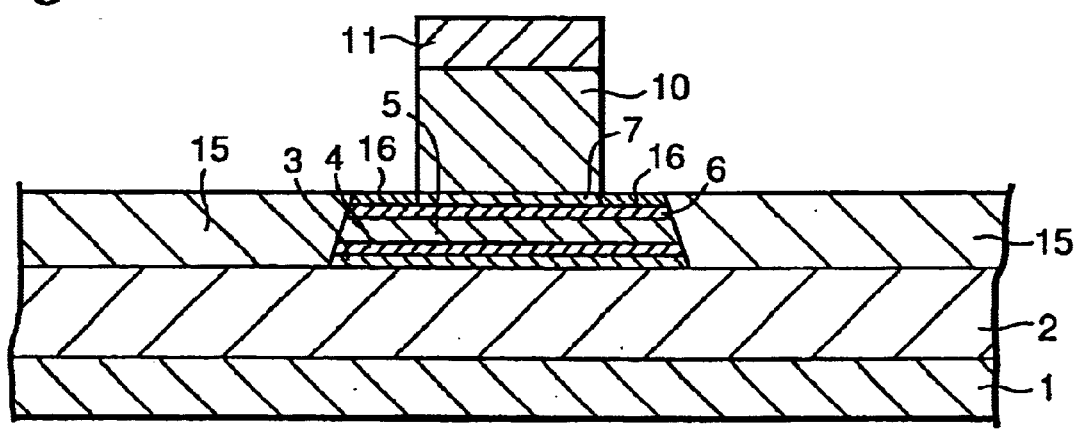

Then as shown in FIG. 17G, resistance of only the p-type AlInAs cladding layer 7 is increased in the region where the splayed portion was etched away. A method similar to those of the fourth through the sixth embodiments may be used for increasing the resistance. To increase the resistance of only the p-type AlInAs cladding layer 7, depth of layer of which resistance is to be increase is controlled by adjusting the furnace temperature and/or the annealing time. After increasing the resistance of only the p-type AlInAs cladding layer 7, the SiO$_2$ insulation layer 20 is etched away as shown in FIG. 17H.

Figure 17I:
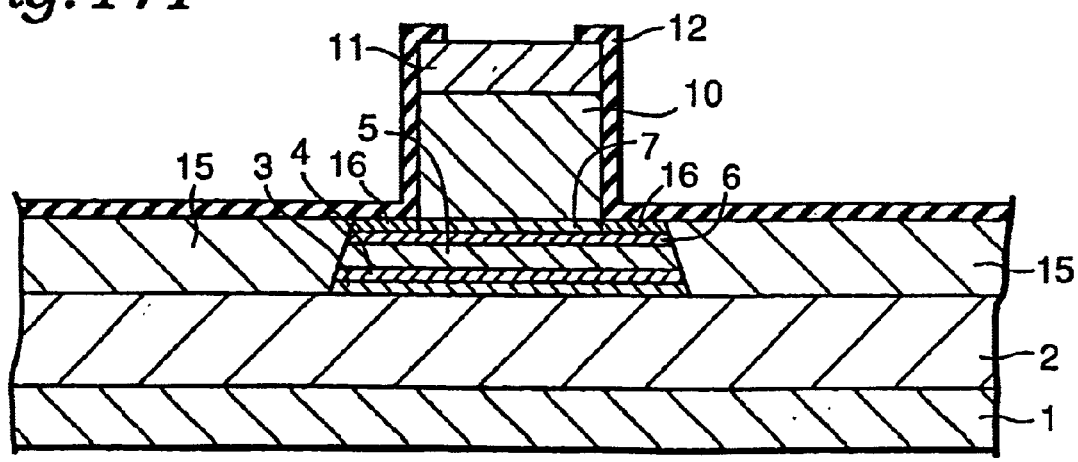
Figure 18:
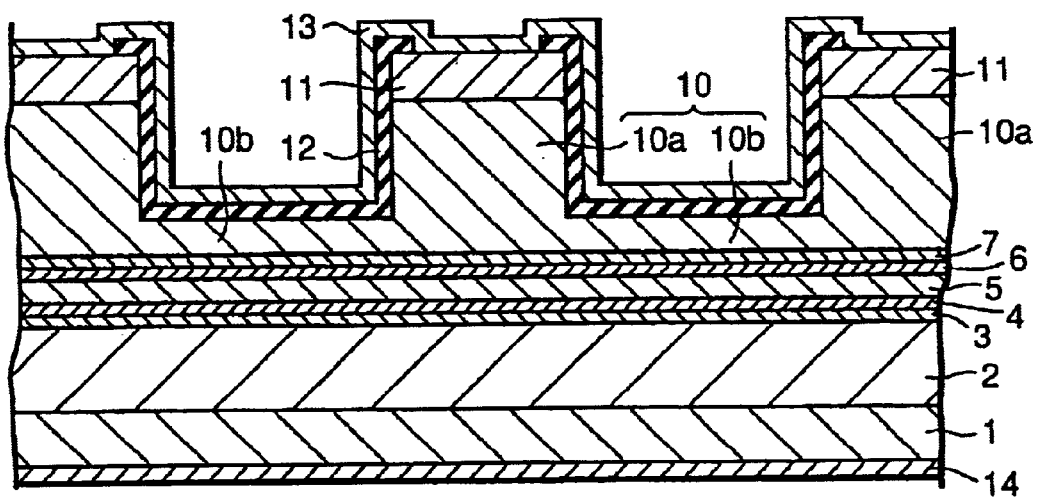
FIG. 18 is a sectional view showing the ridge waveguide semiconductor laser of the prior art.
Figure 19A:
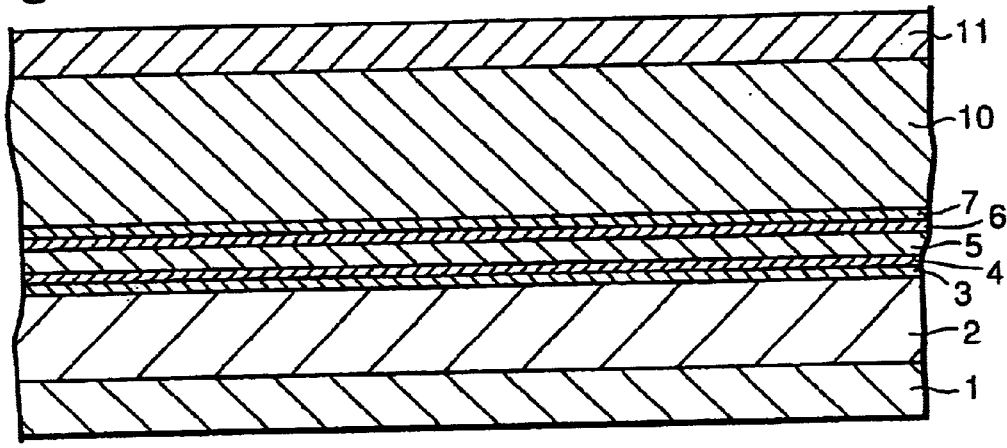
FIGS. 19A through 19F show one half of the process of producing the ridge waveguide semiconductor laser of the prior art.
Figure 19B:
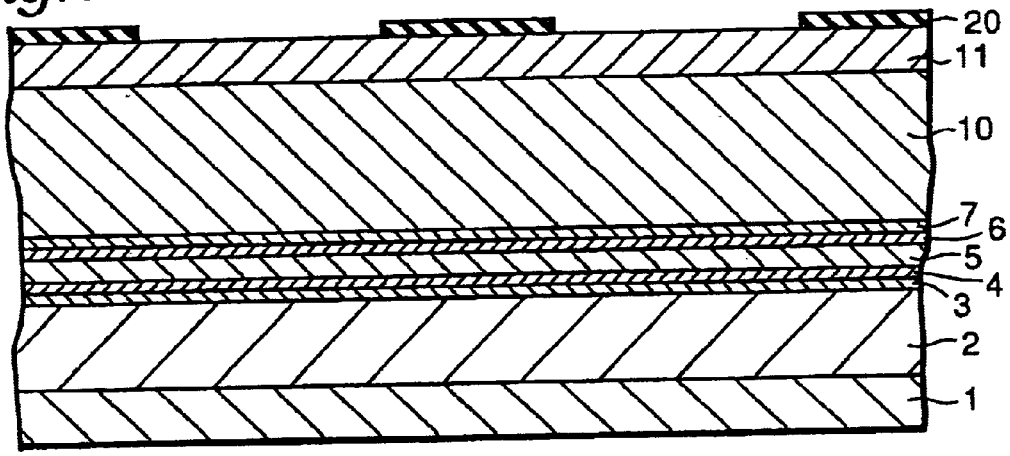
Figure 19C:
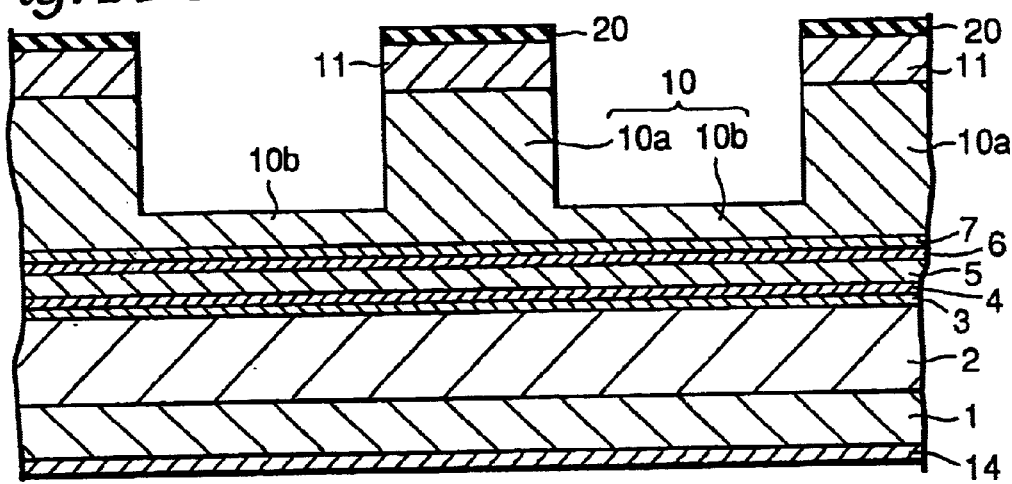
Figure 19D:
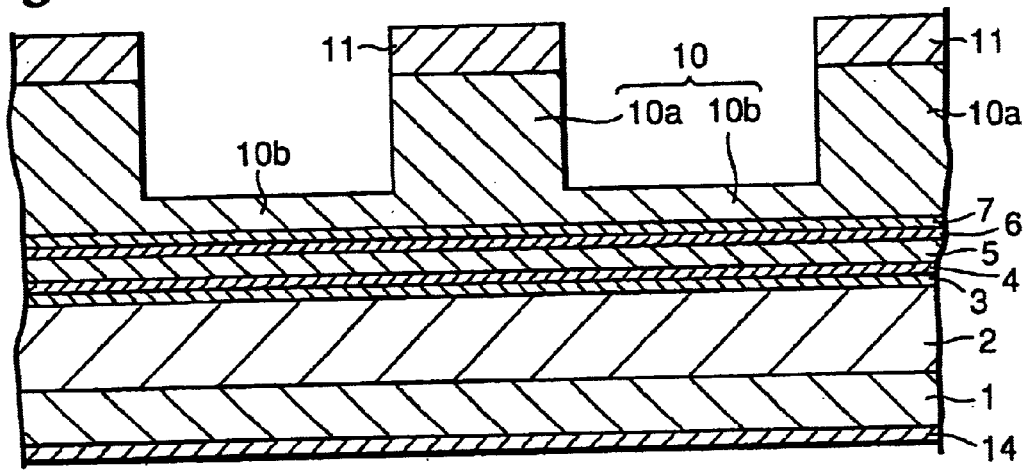
Figure 19E:
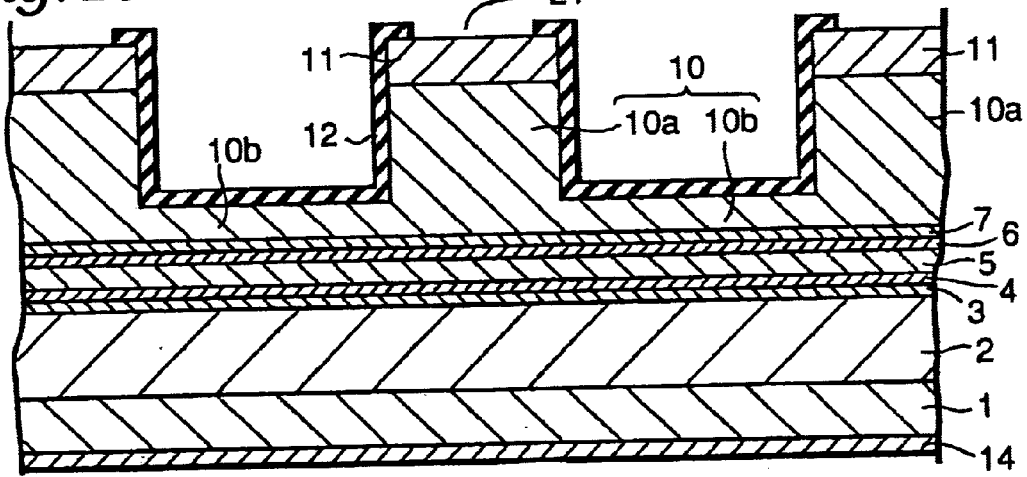
Figure 19F:
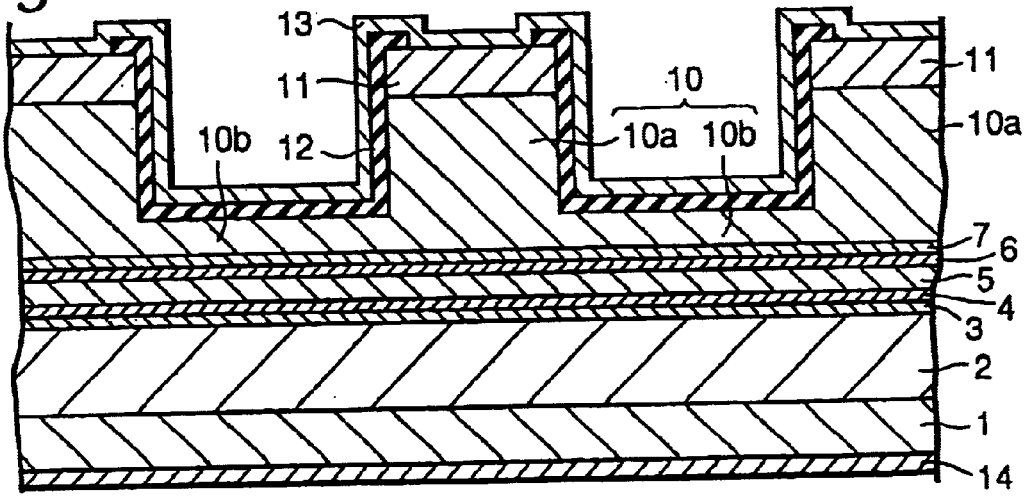
Figure 20A:
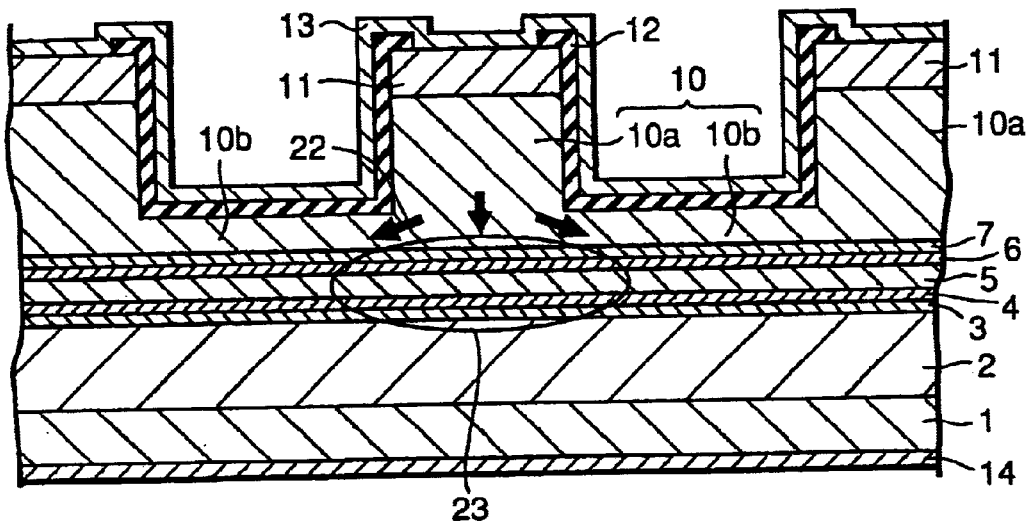
FIG. 20A shows current distribution and light emitting region in case the InP cladding layer is etched deep.
Figure 20B:
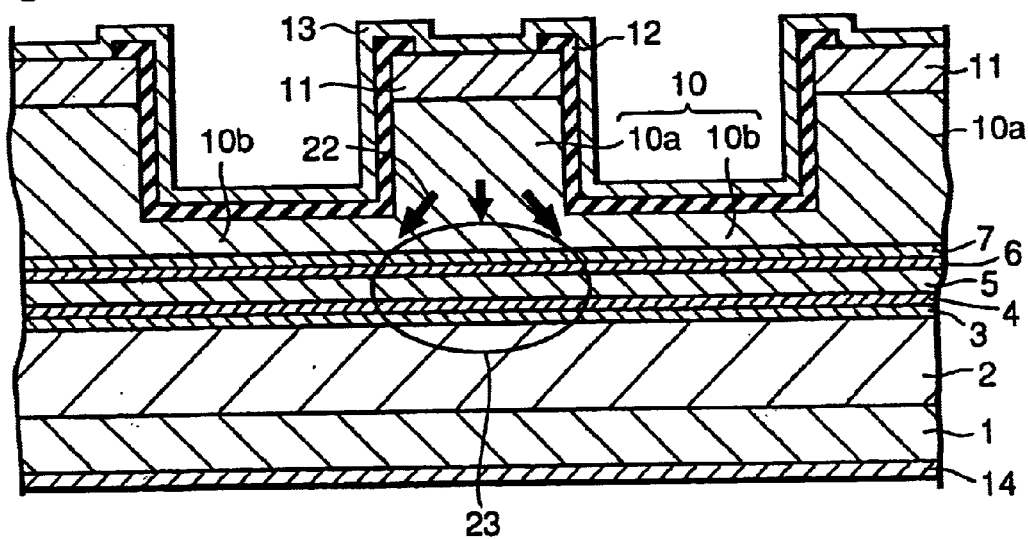
FIG. 20B shows current distribution and light emitting region in case the InP cladding layer is etched to a smaller depth.
Figure 21A:
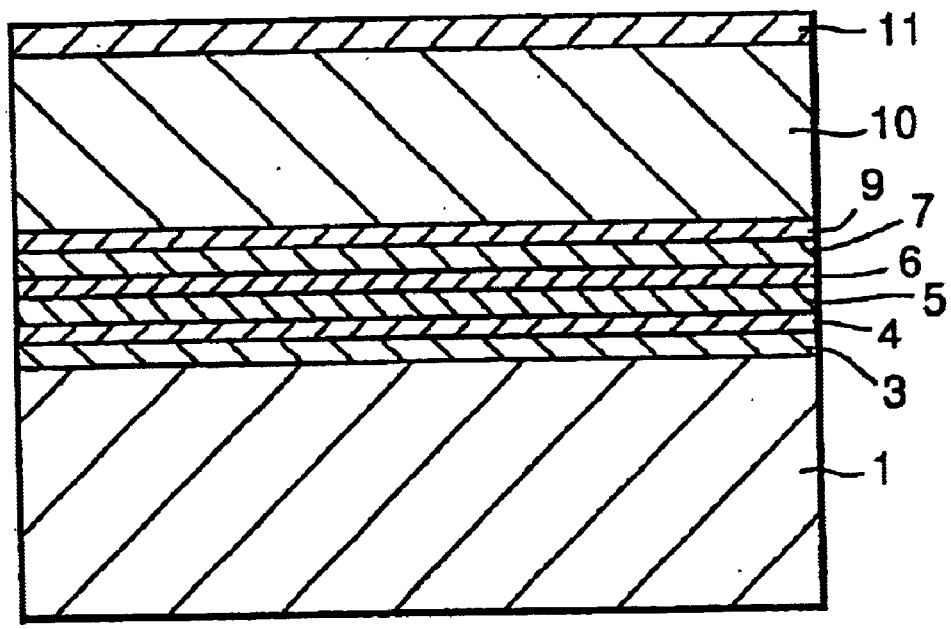
FIGS. 21A and 21B show another example of a process of producing the ridge waveguide semiconductor laser of the prior art.
Figure 21B:
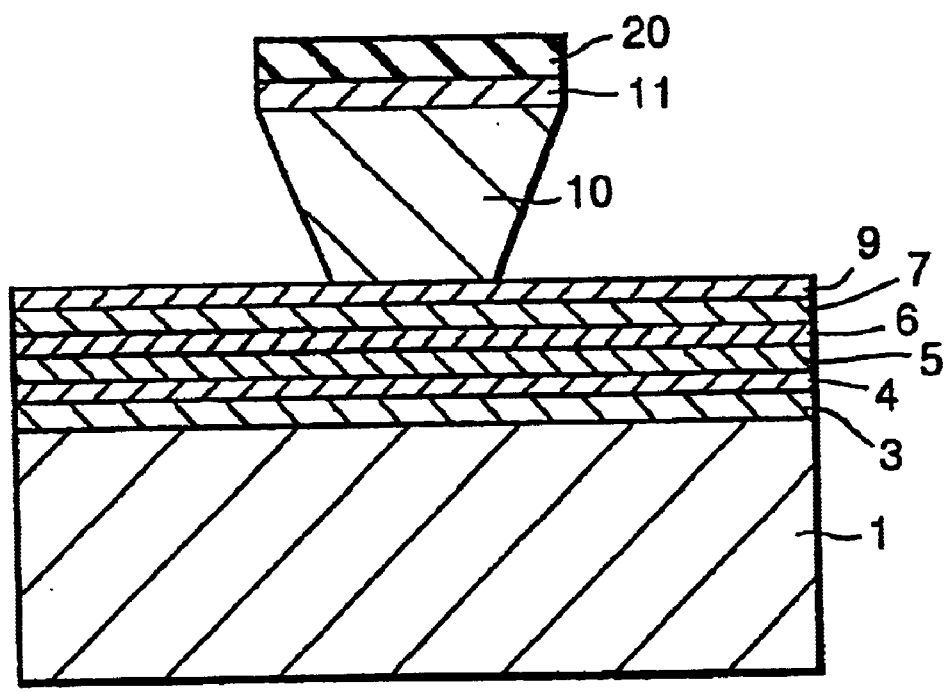
Figure 22:
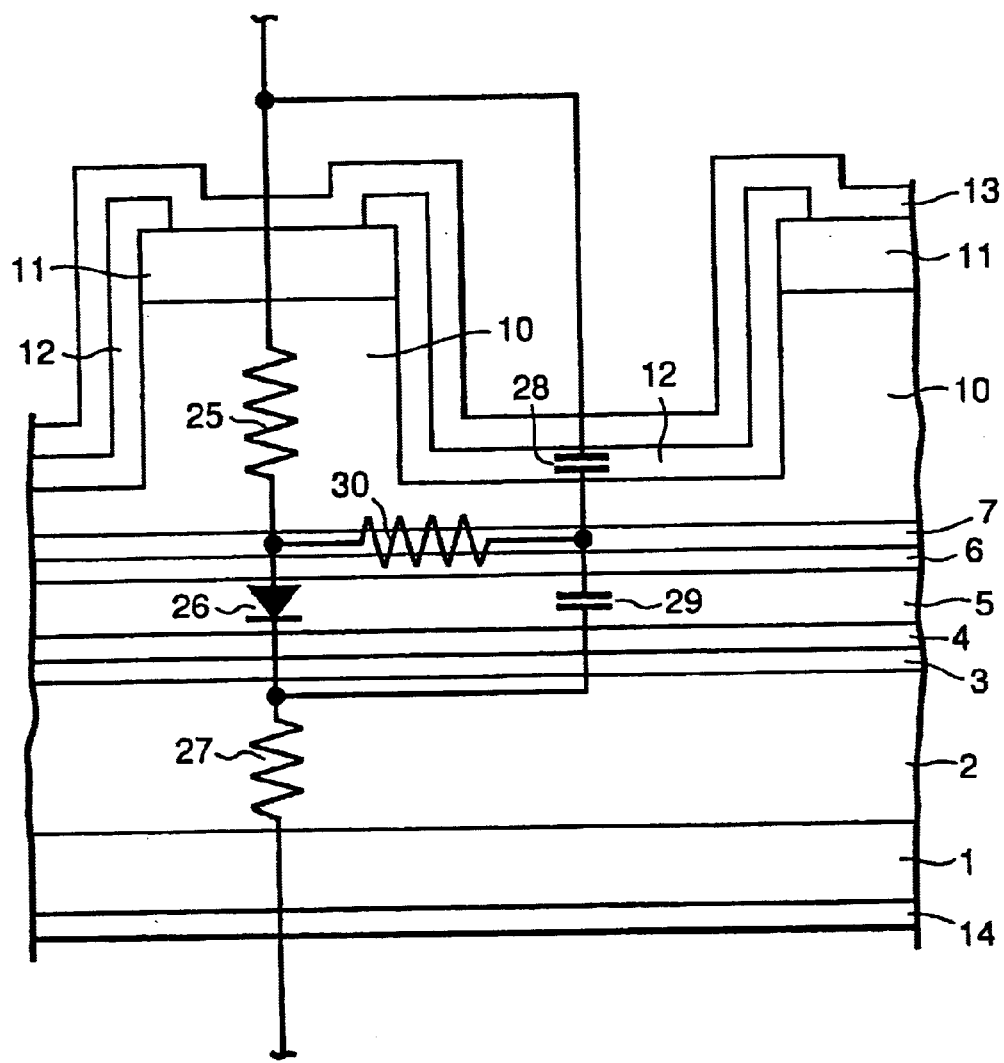
FIG. 22 is a schematic diagram showing an equivalent circuit of the ridge waveguide semiconductor laser of the prior art.

Then the SiO$_2$ insulation layer 12 is formed except the portion on top of the ridge 10 as shown in FIG. 17I. By forming the p-type electrode 13 and the n-type electrode 14 of the laser, the ridge waveguide semiconductor laser shown in FIG. 16 is completed.

While the AlGaInAsP/InP laser is formed on the n-type InP substrate in the embodiments described above, the AlGaInAsP/InP laser may also be formed on a p-type InP substrate in a configuration with a producing method similar to those of the above embodiments, simply by changing the conductivity type. Also the embodiments described above are cases where the p-type and n-type cladding layers are made of AlInAs and the active layers are made of AlGaInAs, although similar effects can be achieved by employing a configuration and a production method that are similar to those of the above embodiments, also in such a case as the cladding layer is made of $Al_xGa_yIn_{1-x-y}As$ ($0<x$, $0\leq y$, $x+y<1$) and the active layers are made of $Al_{x1}Ga_{y1}In_{1-x1-y1}As$ ($0<x_1$, $0\leq y_1$, $x_1+y_1<1$).

Although the present invention has been fully described in conjunction with the preferred embodiments with reference to the accompanying drawings, various modifications and alterations will be apparent for those skilled in the art. Such modifications and alterations that do not deviate from the scope of the present invention set forth in the claims should be regarded as included in the present invention.

What is claimed is:

1. A ridge waveguide semiconductor laser comprising:
   a first conductivity type InP substrate; and
   successively disposed on said InP substrate,
      a first conductivity type cladding layer of $Al_xGa_yIn_{1-x-y}As$ ($0<x$, $0<y$, $x+y<1$),
      an active layer of $Al_{x1}Ga_{y1}In_{1-x1-y1}As$ ($0<x_1$, $0<y_1$, $x_1+y_1<1$),
      a second conductivity type cladding layer of $Al_{x2}Ga_{y2}In_{1-x2-y2}As$ ($0<x_2$, $0<y_2$, $x_2+y_2<1$),
      a first InP cladding layer of the second conductivity type,
      an etching stopping layer of $In_aGa_{1-a}As_bP_{1-b}$ ($0<a<1$, $0<b<1$), and
      a second InP cladding layer of the second conductivity type, said second InP cladding layer having a ridge shape with respective opposed sides, each side including a first portion substantially perpendicular to said InP substrate and a second portion, between the first portion and said InP substrate, oblique to said InP substrate, so that said ridge has a first portion of uniform width and a second portion that becomes wider in a direction extending from the first portion toward said InP substrate.

2. The ridge waveguide semiconductor laser according to claim 1, wherein said etching stopping layer comprises $In_aGa_{1-a}As_bP_{1-b}$ ($0<a<1$, $0<b<1$).

3. The ridge waveguide semiconductor laser according to claim 1 including a first conductivity type AlInAs cladding layer interposed between said first conductivity type InP substrate and said first conductivity type cladding layer of $Al_xGa_yIn_{1-x-y}As$, and a second conductivity type AlInAs cladding layer interposed between said second conductivity type cladding layer of $Al_{x2}Ga_{y2}In_{1-x2-y2}As$ and said first InP cladding layer of the second conductivity type.

4. A ridge waveguide semiconductor laser comprising:
   a first conductivity type InP substrate; and
   successively disposed on said InP substrate,
      a first conductivity type cladding layer of $Al_xGa_yIn_{1-x-y}As$ ($0<x$, $0<y$, $x+y<1$),
      an active layer of $Al_{x1}Ga_{y1}In_{1-x1-y1}As$ ($0<x_1$, $0<y_1$, $x_1+y_1<1$),
      a second conductivity type cladding layer of $Al_{x2}Ga_{y2}In_{1-x2-y2}As$ ($0<x_2$, $0<y_2$, $x_2+y_2<1$),
      an InP cladding layer of the second conductivity type and having a ridge shape with respective opposed sides, each side including a first portion substantially perpendicular to said InP substrate and a second portion, between the first portion and said InP substrate, oblique to said InP substrate, so that said ridge has a first portion of uniform width and a second portion that becomes wider in a direction extending from the first portion toward said InP substrate, and
      a metal electrode covering the ridge shape of said InP cladding layer.

5. The ridge waveguide semiconductor laser according to claim 4 including a first conductivity type AlInAs cladding layer interposed between said first conductivity type InP substrate and said first conductivity type cladding layer of $Al_xGa_yIn_{1-x-y}As$, and a second conductivity type AlInAs cladding layer interposed between said second conductivity type cladding layer of $Al_{x2}Ga_{y2}In_{1-x2-y2}As$ and said InP cladding layer of the second conductivity type.

6. A ridge waveguide semiconductor laser comprising:
   a first conductivity type InP substrate; and
   successively disposed on said InP substrate,
      a first conductivity type cladding layer of $Al_xGa_yIn_{1-x-y}As$ ($0<x$, $0<y$, $x+y<1$),
      an active layer of $Al_{x1}Ga_{y1}In_{1-x1-y1}As$ ($0<x_1$, $0<y_1$, $x_1+y_1<1$) having a main current path,
      a second conductivity type cladding layer of $Al_{x2}Ga_{y2}In_{1-x2-y2}As$ ($0<x_2$, $0<y_2$, $x_2+y_2<1$) wherein first and second higher resistance regions sandwich the main current path of said active layer, said first conductivity type cladding layer, and said second conductivity type cladding layer,
      an InP cladding layer of the second conductivity type, having a ridge shape, and opposite the main current path of said active layer, and
      a metal electrode in electrical communication with said InP cladding layer.

7. The ridge waveguide semiconductor laser according to claim 6, wherein said active layer sandwiched by said high resistance regions is no wider than and located directly opposite the ridge shape of said InP cladding layer.

8. The ridge waveguide semiconductor laser according to claim 7, wherein said ridge shape has respective opposed sides, each side including a first portion substantially perpendicular to said InP substrate and a second portion, between the first portion and said InP substrate, oblique to said InP substrate, so that said ridge has a first portion of uniform width and a second portion that becomes wider in a direction extending from the first portion toward said InP substrate.

9. The ridge waveguide semiconductor laser according to claim 6, wherein said active layer sandwiched by said higher resistance regions is wider than the ridge shape of said InP cladding layer.

10. The ridge waveguide semiconductor laser according to claim 9, wherein said second conductivity type cladding layer includes higher resistance regions sandwiching a lower resistance region of said second conductivity cladding layer, the lower resistance region being located directly opposite the ridge shape of said InP cladding layer.

11. The ridge waveguide semiconductor laser according to claim 6 including a first conductivity type AlInAs cladding layer interposed between said first conductivity type InP substrate and said first conductivity type cladding layer of $Al_xGa_yIn_{1-x-y}As$, and a second conductivity type AlInAs cladding layer interposed between said second conductivity type cladding layer of $Al_{x2}Ga_{y2}In_{1-x2-y2}As$ and said InP cladding layer of the second conductivity type.

* * * * *

UNITED STATES PATENT AND TRADEMARK OFFICE
CERTIFICATE OF CORRECTION

PATENT NO. : 6,618,411 B1
DATED : September 9, 2003
INVENTOR(S) : Takiguchi et al.

It is certified that error appears in the above-identified patent and that said Letters Patent is hereby corrected as shown below:

<u>Title page,</u>
Item [*] Notice, change "Subject to any disclaimer, the term of this patent is extended or adjusted under 35 U.S.C. 154(b) by 0 days." to -- Subject to any disclaimer, the term of this patent is extended or adjusted under 35 U.S.C. 154(b) by 364 days. --.

Signed and Sealed this

Thirtieth Day of December, 2003

JAMES E. ROGAN
*Director of the United States Patent and Trademark Office*